US012660505B2

(12) United States Patent
Kitade et al.

(10) Patent No.: US 12,660,505 B2
(45) Date of Patent: Jun. 16, 2026

(54) PIEZOELECTRIC COIL AND ELECTRONIC APPARATUS

(71) Applicant: Sony Group Corporation, Tokyo (JP)

(72) Inventors: Shuta Kitade, Tokyo (JP); Toru Udaka, Tokyo (JP); Yuichi Ishida, Tokyo (JP); Nobuyuki Nagai, Tokyo (JP); Miki Endo, Tokyo (JP)

(73) Assignee: SONY GROUP CORPORATION, Tokyo (JP)

( * ) Notice: Subject to any disclaimer, the term of this patent is extended or adjusted under 35 U.S.C. 154(b) by 912 days.

(21) Appl. No.: 17/919,605

(22) PCT Filed: Apr. 8, 2021

(86) PCT No.: PCT/JP2021/014906
§ 371 (c)(1),
(2) Date: Oct. 18, 2022

(87) PCT Pub. No.: WO2021/215260
PCT Pub. Date: Oct. 28, 2021

(65) Prior Publication Data
US 2023/0225214 A1 Jul. 13, 2023

(30) Foreign Application Priority Data

Apr. 20, 2020 (JP) ................................. 2020-074647

(51) Int. Cl.
*H01L 41/02* (2006.01)
*H10N 30/40* (2023.01)
*H10N 30/88* (2023.01)
(52) U.S. Cl.
CPC ............. *H10N 30/40* (2023.02); *H10N 30/88* (2023.02)

(58) Field of Classification Search
CPC .............................. H10N 30/40; H10N 30/88
USPC .................................................. 310/367, 369
See application file for complete search history.

(56) References Cited

U.S. PATENT DOCUMENTS

| | | | |
|---|---|---|---|
| 2004/0017129 A1* | 1/2004 | Hooley | H04R 17/00 |
| | | | 310/311 |
| 2018/0277740 A1* | 9/2018 | Kim | H10N 30/857 |
| 2019/0003905 A1 | 1/2019 | Yoshida et al. | |
| 2019/0214542 A1 | 7/2019 | Yoshida et al. | |
| 2020/0058844 A1* | 2/2020 | Tanimoto | H10N 30/20 |

FOREIGN PATENT DOCUMENTS

| | | |
|---|---|---|
| CN | 1434985 A | 8/2003 |
| CN | 108701753 A | 10/2018 |
| CN | 109716084 A | 5/2019 |

(Continued)

OTHER PUBLICATIONS

International Search Report from corresponding PCT application PCT/JP2021/014906, dated Jun. 29, 2021.

*Primary Examiner* — Derek J Rosenau
(74) *Attorney, Agent, or Firm* — K&L Gates LLP

(57) ABSTRACT

[Object] To provide a technology such as a piezoelectric coil having higher energy conversion efficiency.
[Solving Means] A piezoelectric coil according to the present technology includes a coil-like core material and a plurality of band-like piezoelectric materials. The plurality of piezoelectric materials is helically wound around the core material so as to be alternately arranged along the core material.

22 Claims, 17 Drawing Sheets

(56)    References Cited

FOREIGN PATENT DOCUMENTS

| | | | |
|---|---|---|---|
| EP | 3376549 | A1 | 9/2018 |
| EP | 3505892 | A1 | 7/2019 |
| JP | H06216424 | A | 8/1994 |
| JP | 2003518752 | A | 6/2003 |
| KR | 100686774 | B1 | 2/2007 |
| KR | 20180082499 | A | 7/2018 |
| WO | 2001047041 | A2 | 6/2001 |
| WO | 2017111108 | A1 | 6/2017 |
| WO | 2018062056 | A1 | 4/2018 |

* cited by examiner

10(10c)

2   2   2   2
(2a)(2b)(2c)(2d)

Y

Z •——→ X

10(10c)

2   2   2   2
(2a)(2b)(2c)(2d)

Z

Y ←   ↑   → X

Comparative example
Number of piezoelectric materials : 1

Example 1
Number of piezoelectric materials : 2

Example 2
Number of piezoelectric materials : 3

Example 3
Number of piezoelectric materials : 4

PIEZOELECTRIC COIL AND ELECTRONIC APPARATUS

TECHNICAL FIELD

The present technology relates to a piezoelectric coil.

BACKGROUND ART

Patent Literature 1 below has described a piezoelectric actuator configured by helically winding a band-like piezoelectric element around a surface of a coil spring. In this piezoelectric actuator, the piezoelectric element deforms in a longitudinal direction when an electric field is applied on the piezoelectric element. Then, the deformation of the piezoelectric element causes a torsion moment on a cross-section of the coil spring, and the coil spring deforms in an axial direction.

CITATION LIST

Patent Literature

Patent Literature 1: Japanese Patent Application Laid-open No. HEI 6-216424

DISCLOSURE OF INVENTION

Technical Problem

The piezoelectric actuator described in Patent Literature 1 has a problem in that the piezoelectric element's force applied to the coil spring is dispersive, which deteriorates the energy conversion efficiency.

In view of the above-mentioned circumstances, it is an objective of the present technology to provide a technology such as a piezoelectric coil having higher energy conversion efficiency.

Solution to Problem

A piezoelectric coil according to the present technology includes a coil-like core material and a plurality of band-like piezoelectric materials.

The plurality of piezoelectric materials is helically wound around the core material so as to be alternately arranged along the core material.

By setting the number of piezoelectric materials to be plural in this manner, the energy conversion efficiency can be improved.

An electronic apparatus according to anther embodiment of the present technology includes a piezoelectric coil.

The piezoelectric coil includes a coil-like core material and a plurality of band-like piezoelectric materials.

The plurality of piezoelectric materials is helically wound around the core material so as to be alternately arranged along the core material.

MODE(S) FOR CARRYING OUT THE INVENTION

Hereinafter, embodiments according to the present technology will be described with reference to the drawings.

First Embodiment

<Overall Configuration and Configurations of Respective Parts>

Figure 1:
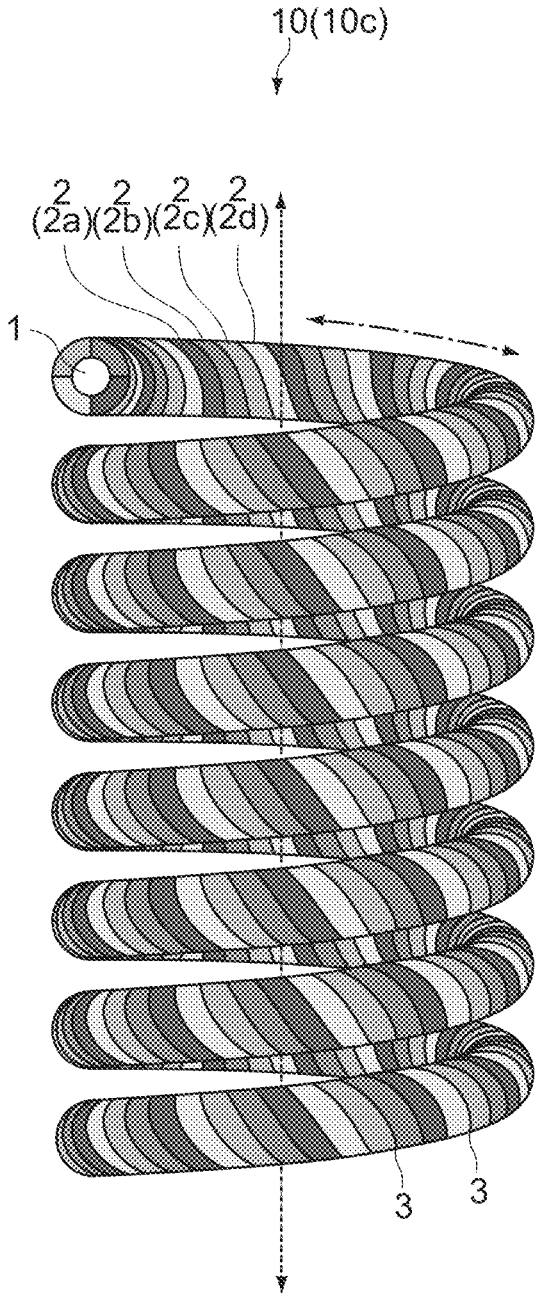
FIG. 1 A side view showing a piezoelectric coil according to a first embodiment.
Figure 1:
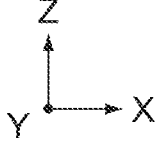
Figure 2:
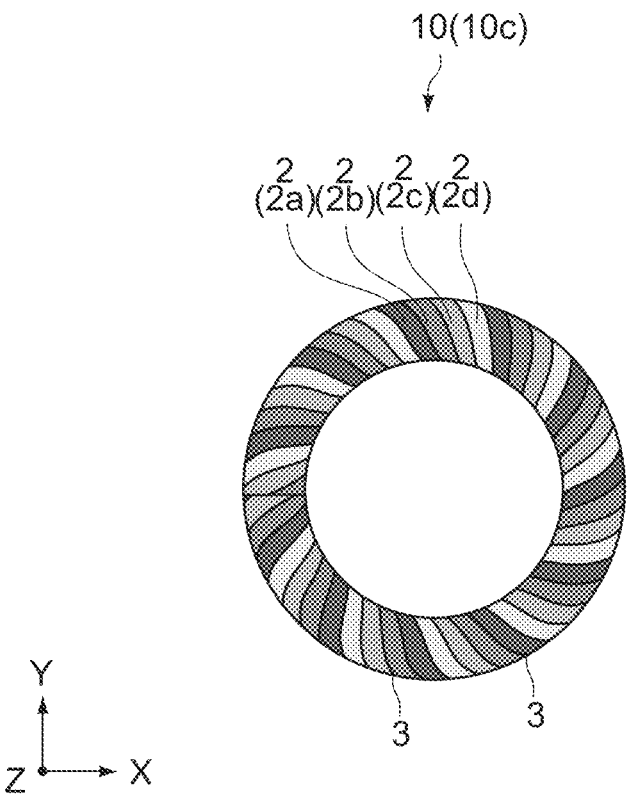
FIG. 2 A top view showing the piezoelectric coil.
Figure 3:
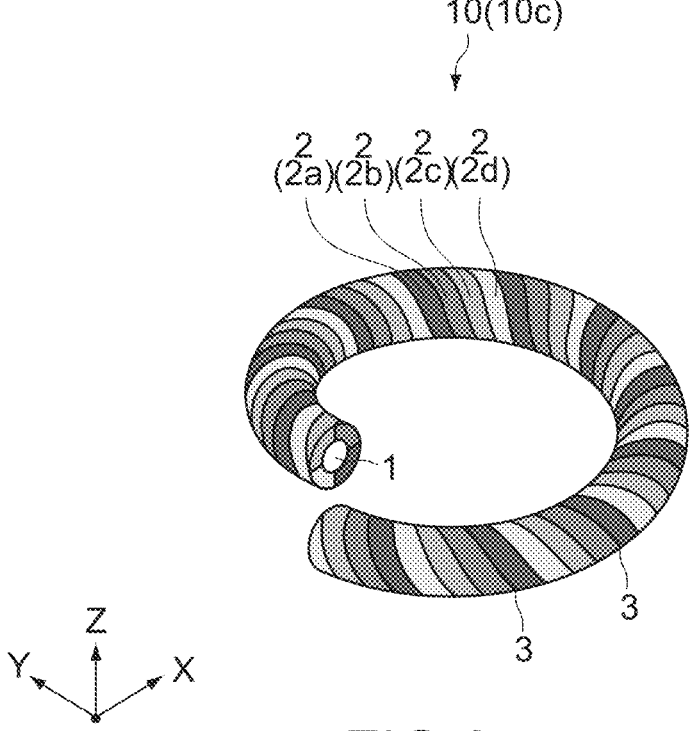
FIG. 3 A perspective view showing the piezoelectric coil.
Figure 4:
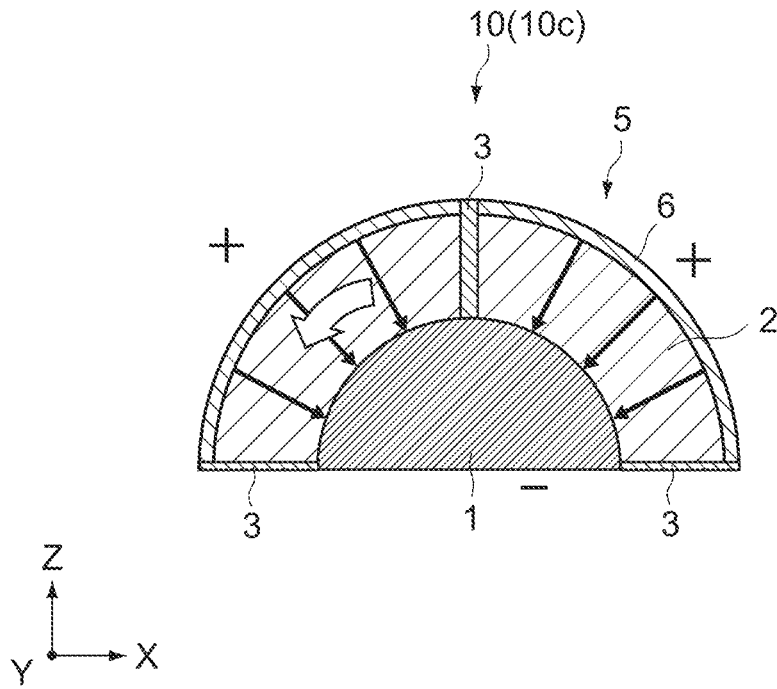
FIG. 4 A cross-sectional view of the piezoelectric coil.

FIG. 1 is a side view showing a piezoelectric coil 10 according to a first embodiment. FIG. 2 is a top view showing the piezoelectric coil 10. FIG. 3 is a perspective view showing the piezoelectric coil 10. FIG. 4 is a cross-sectional view of the piezoelectric coil 10.

In FIGS. 1 to 3, the illustration of surface electrodes 6 shown in FIG. 4 is omitted. Moreover, FIG. 3 shows a base unit of one turn in the piezoelectric coil 10. Moreover, FIG. 4 partially shows a half of a cross-section of the piezoelectric coil 10.

As shown in FIGS. 1 to 4, the piezoelectric coil 10 is configured in a coil spring shape and is capable of extending and contracting in a central axial direction of the coil (see the dotted line (Z-axis direction) in FIG. 1). It should be noted that the number of turns of the entire piezoelectric coil 10, the number of turns per unit length, and the like can be arbitrarily set.

The piezoelectric coil 10 includes a coil-like core material 1 and a plurality of band-like piezoelectric materials 2 helically wound around the core material 1 so as to be alternately arranged in a length direction of the core material 1 (see the long dashed short dashed line in FIG. 1). Moreover, the piezoelectric coil 10 includes an electrode portion 5 that applies an electric field on the piezoelectric materials 2 in thickness directions of the piezoelectric materials 2.

The core material 1 is configured in a coil spring shape and has a circular cross-section (cross-section perpendicular to the length direction of the core material 1). It should be noted that the cross-section of the core material 1 may have an elliptical shape, a polygonal shape, or the like and the cross-section shape is not particularly limited.

The core material 1 is constituted by, for example, at least one kind of material selected from graphite, Mg alloy, Al, Ti, SUS, W, Au, Ag, Cu, Pt, ceramics, and polymer resin.

Each piezoelectric material 2 is configured to be long in the length direction, short in the width direction, and have a thin band-shape in the thickness direction. In the example shown in FIGS. 1 to 4, the number of piezoelectric materials 2 is four. It is sufficient that the number of piezoelectric materials 2 is typically two or more, and this number is within a suitable range. This range will be described later in detail with reference to FIGS. 14 and 15 to be described later.

It should be noted that in the descriptions of this specification, as the respective piezoelectric materials 2 are not particularly distinguished, they will be simply referred to as the piezoelectric materials 2, and as the respective piezoelectric materials 2 are distinguished, they will be referred to as a first piezoelectric material 2a, a second piezoelectric material 2b, a third piezoelectric material 2c, a fourth piezoelectric material 2d, . . . depending on the number of piezoelectric materials 2.

The piezoelectric materials 2 are helically wound around the core material 1 so as to be alternately arranged, e.g., the first piezoelectric material 2a, the second piezoelectric material 2b, the third piezoelectric material 2c, the fourth piezoelectric material 2d, the first piezoelectric material 2a, the second piezoelectric material 2b, the third piezoelectric material 2c, the fourth piezoelectric material 2d, . . . in the length direction of the core material 1 (see the long dashed short dashed line in FIG. 1). In other words, the piezoelectric materials 2 are configured as if a single piezoelectric material 2 helically wound around the core material 1 was divided into a plurality of parts in the width direction of the piezoelectric material 2.

The piezoelectric material 2 is wound at a predetermined angle with respect to the length direction of the core material 1 (see the long dashed short dashed line in FIG. 1). Hereinafter, the angle at which the piezoelectric material 2 is wound around the core material 1 will be referred to as a winding angle. As to the winding angle, a direction parallel to the length direction of the core material 1 is set to 0 degrees. The winding angle will be described later in detail with reference to FIG. 7 to be described later.

The piezoelectric materials 2 is configured using, as a base material, at least one kind of material selected from, for example, $Pb(Zr, Ti)O_3$ [PZT], $PbTiO_3$, $Pb(Mg_{1/3}Nb_{2/3})O_3$—$PbTiO_3$ [PMN-PT], $Pb(Zn_{1/3}Nb_{2/3})O_3$—$PbTiO_3$ [PZN-PT], $BaTiO_3$ [BT], $(K, Na)NbO_3$ [KNN], $KNbO_3$, $NaNbO_3$, $(K, Na, Li)NbO_3$, $(K, Na, Li)$ $(Nb, Ta, Sb)O_3$, $(Sr, Ba)Nb_2O_6$, $(Sr, Ca)NaNb_5O_{15}$, $(Na, K)Ba_2$ $NbO_{15}$, $BiFeO_3$, $Bi_4Ti_3O_{12}$, $(Bi_{1/2}K_{1/2})TiO_3$, $(Bi_{1/2}Na_{1/2})TiO_3$, $BaTiO_3$—$(Bi_{1/2}K_{1/2})$ $TiO_3$, $BaTiO_3$—$(Bi_{1/2}Na_{1/2})TiO_3$, AlN, $LiNbO_3$, $LiTaO_3$, $\alpha$-$SiO_2$, $GaPO_4$, $LiB_4O_7$, $La_3Ga_5SiO_{14}$, $La_3Ta_{0.5}Ga_{5.5}O_{14}$, $MgSiO_3$, ZnO, poly vinylidene difluoride [PVDF], halide perovskite-based piezoelectric material, polylactic acid [PLLA], cellulose, and polypeptide.

The material used for the core material 1 and the material used for the piezoelectric materials 2 are may be selected on the basis of a Young's modulus relationship between the materials used for them. The Young's modulus relationship between the material used for the core material 1 and the material used for the piezoelectric materials 2 will be described later in detail with reference to FIG. 16 to be described later.

In the present embodiment, the piezoelectric materials 2 are constituted by the same material. On the other hand, a material for some piezoelectric materials 2 of the piezoelectric materials 2 may be different from a material for the other piezoelectric materials 2.

It should be noted that insulating portions 3 are each interposed between the piezoelectric materials 2 adjacent to each other in the length direction of the core material 1 (see the long dashed short dashed line in FIG. 1). An insulative material having softness relatively higher than that of the material used for the piezoelectric materials 2 is typically used as a material used for the insulating portions 3. Examples of the material that satisfies this condition can include synthetic resin and synthetic resin foam. It should be noted that interposing each insulating portion 3 between the piezoelectric materials 2 adjacent to each other is for electrically insulating the piezoelectric materials 2 from each other. Moreover, using the highly soft material as the material used for the insulating portions 3 is for preventing damage of the piezoelectric materials 2 by overcoming, through the insulating portions 3, influences such as pressure and friction that the piezoelectric materials 2 apply to the adjacent piezoelectric materials 2 when the piezoelectric materials 2 are deformed.

It should be noted that the insulating portions 3 may be air gaps each formed between the piezoelectric materials 2 adjacent to each other. Also in a case where the insulating portions 3 are air gaps, the piezoelectric materials 2 can be electrically insulated from each other with the air gaps, and influences such as pressure and friction that the piezoelectric materials 2 apply to the adjacent piezoelectric materials 2 when the piezoelectric materials 2 are deformed can be overcome through the air gaps.

The electrode portion 5 is configured to be capable of applying an electric field (direct current or alternate current) on the piezoelectric materials 2 in the thickness directions of the piezoelectric materials 2. Although an electric field is applied in the thickness directions of the piezoelectric materials 2 in the present embodiment, an electric field may be applied in length directions of the piezoelectric materials 2 (see FIG. 22 to be described later). The piezoelectric materials 2 are deformed when the electrode portion 5 applies an electric field on the piezoelectric materials 2, and at this time, extension and contraction in longitudinal directions of the piezoelectric materials 2 contribute to deformation in the piezoelectric coil 10 in the central axial direction (see the dotted line in FIG. 1).

The electrode portion 5 includes the core material 1 (first electrode) and the surface electrodes 6 (second electrode) that sandwich the piezoelectric materials 2 between the surface electrodes 6 (second electrode) and the core material 1 in the thickness directions of the piezoelectric materials 2. One of the core material 1 and a surface electrode 6 is a positive electrode and the other is a negative electrode.

In the present embodiment, the core material 1 functions as both a coil spring and a part of the electrode portion 5. In this manner, in a case where the core material 1 functions as a part of the electrode portion 5, a material having relatively high electrical conductivity (e.g., graphite, Mg alloy, metal such as Al, Ti, SUS, W, Au, Ag, Cu, and Pt) is used as the material for the core material 1.

On the other hand, the electrode layer (first electrode) may be specially formed on a surface of the core material 1 by vapor deposition, sputtering, coating, or the like. That is, an electrode layer may be interposed between the surface of the core material 1 and the back surfaces of the piezoelectric materials 2. In this case, since the core material 1 does not need to serve as a part of the electrode portion 5, an insulator, for example, can also be used as the material for the core material 1.

It should be noted that the electrode layer in a case where the electrode layer is interposed between the surface of the core material 1 and the back surfaces of the piezoelectric materials 2 will be hereinafter referred to as a back electrode (first electrode) (not shown) for the sake of convenience. This back electrode is constituted by a variety of materials having relatively high electrical conductivity (e.g., metal).

The surface electrodes 6 are constituted by, for example, a variety of materials having relatively high conductivity (e.g., metal). The surface electrodes 6 are provided in a layer form to cover the entire surfaces of the piezoelectric materials 2 on the surfaces of the piezoelectric materials 2. The surface electrodes 6 are individually provided on the piezoelectric materials 2, respectively, and are in a helical form with respect to the core material 1 like the piezoelectric materials 2. It should be noted that the insulating portions 3 are each interposed between the surface electrodes 6 adjacent to each other in the length direction of the core material 1.

For example, the surface electrodes 6 are formed on the surfaces of the piezoelectric materials 2 by vapor deposition, sputtering, coating, or the like and the piezoelectric materials 2 on which the surface electrodes 6 are formed are helically wound around the core material 1.

Moreover, in a case of a configuration in which the back electrode is interposed between the core material 1 and the piezoelectric materials 2, the surface electrodes 6 and the back electrode are respectively formed on the surfaces and back surfaces of the piezoelectric materials 2 by vapor deposition, sputtering, coating, or the like. After that, the piezoelectric materials 2 on which the surface electrodes 6 and the back electrode are formed may be helically wound around the core material 1. In this case, the back electrode is also in a helical form with respect to the core material 1.

Here, in the present embodiment, an example in a case where the piezoelectric coil 10 is used as a piezoelectric actuator by utilizing an inverse piezoelectric effect of the piezoelectric materials 2 (effect of deforming the piezoelectric materials 2 by applying an electric field on the piezoelectric materials 2) will be mainly described. On the other hand, the piezoelectric coil 10 may be used as a power generation element (see FIG. 17 to be described later) by utilizing a direct piezoelectric effect of the piezoelectric materials 2 (effect of generating voltage due to the deformation of the piezoelectric materials 2).

<Piezoresponse Performance>

The inventors of the present technology compared piezoresponse performance (deformation, generated force) between a plurality of kinds of piezoelectric coils 10 and 10' different in the number of piezoelectric materials 2 in simulation.

Figure 5:
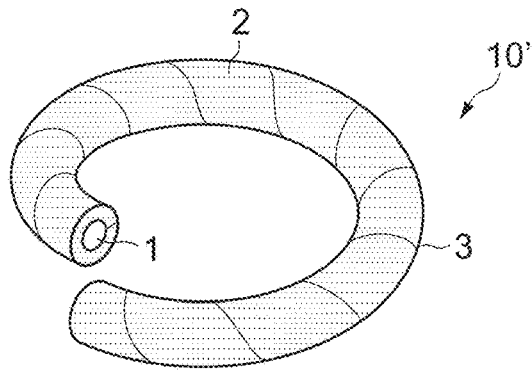
FIG. 5 A diagram showing respective piezoelectric coils used in simulation.
Figure 5:
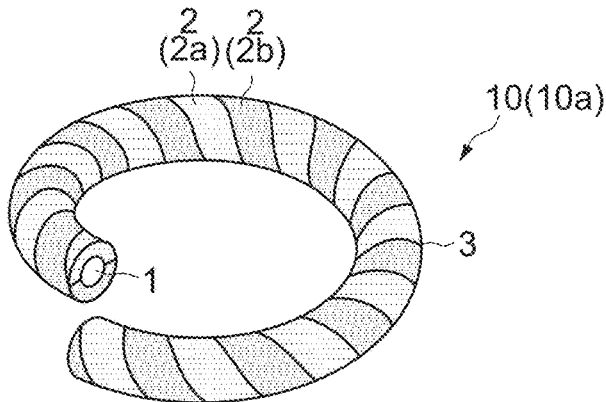
Figure 5:
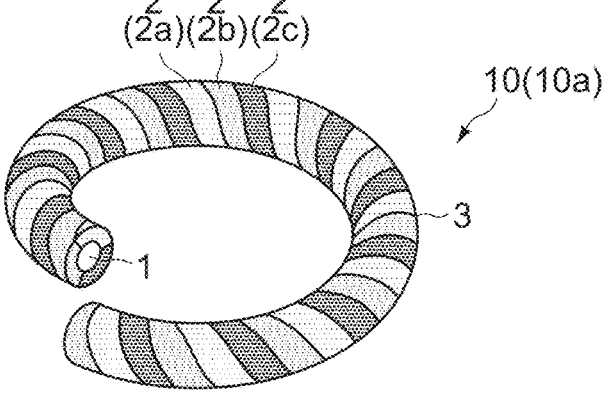
Figure 5:
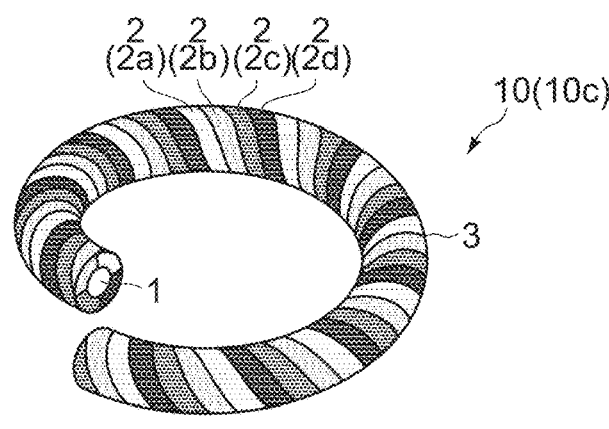
Figure 5:
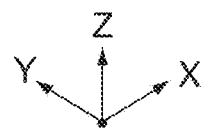

FIG. 5 is a diagram showing respective piezoelectric coils 10 and 10' used in the simulation. As shown in FIG. 5, in this simulation, a base unit of one turn was used as each of the piezoelectric coils 10 and 10'.

In FIG. 5, the top picture shows a piezoelectric coil 10' according to a comparative example and shows a case where the number of piezoelectric materials 2 was single. In FIG. 5, the other pictures show piezoelectric coils 10*a*, 10*b*, and 10*c* according to Examples 1 to 3 of the present technology and show cases where the number of piezoelectric materials 2 was two, three, and four in order from the upper side. It should be noted that the piezoelectric coil 10*c* according to Example 3 in which the number of piezoelectric materials 2 was four corresponds to the piezoelectric coil 10 shown in FIGS. 1 to 4.

Here, provided that the width of the single piezoelectric material 2 according to the comparative example is denoted by w, the widths of the piezoelectric materials 2 in Example 1, Example 2, and Example 3 in the cases where the number of piezoelectric materials 2 was two, three, and four are w/2, w/3, and w/4. It should be noted that the volume of the piezoelectric material 2 is common to the comparative example and respective Examples.

In this simulation, the following conditions common to all the piezoelectric coils 10 and 10' were set and the piezoelectric performance (deformation, generated force) was calculated under these conditions.

Material for the core material 1: SUS
Material for the piezoelectric material 2: hard PZT ceramics
Maximum outer diameter of the coil (the diameter of the core material 1+the thickness of the piezoelectric material 2×2): 1 mm
Winding angle of the piezoelectric material 2: 45 degrees
Occupancy rate (rate indicating how much degree the piezoelectric materials 2 cover the surface of the core material 1): 99.7%
Applied electric field: 10 MV/m
Boundary surface between the core material 1 and the piezoelectric materials 2: fixed
Under such conditions, the deformation and generated force were calculated as the piezoresponse performance in the simulation. The deformation is a rate indicating how much degree the piezoelectric coil 10 deforms (contracts) in the central axial direction of the coil (see the dotted line in FIG. 1) when a predetermined electric field (10 MV/m) is applied on the piezoelectric materials 2 as compared to a case where the electric field is not applied. Moreover, the generated force is force generated by the piezoelectric coil 10 in the central axial direction of the coil when a predetermined electric field (10 MV/m) is applied on the piezoelectric materials 2.

As a result of the simulation, in the piezoelectric coil 10' according to the comparative example (piezoelectric materials 2: single), the deformation was 9% and the generated force was 0.069 MPa. Moreover, in the piezoelectric coil 10a according to Example 1 in which the two piezoelectric materials 2 were used, the deformation was 16% and the generated force was 0.097 MPa. Moreover, in the piezoelectric coil 10b according to Example 2 in which the three piezoelectric materials 2 were used, the deformation was 19% and the generated force was 0.11 MPa. Moreover, in the piezoelectric coil 10c according to Example 3 in which the four piezoelectric materials 2 were used, the deformation was 20% and the generated force was 0.11 MPa.

It can be seen from this result that in each Example according to the present technology, the piezoresponse performance is improved as compared to the comparative example. Specifically, in each Example according to the present technology, the volume of the piezoelectric material 2 and the applied voltage on the piezoelectric materials 2 were equal to those of the comparative example, but the deformation and generated force are improved about twice at most as compared to the comparative example.

<Winding Angle and Occupancy Rate>

Here, as to the degree of freedom in structure of the piezoelectric coil 10, the winding angle of the piezoelectric materials 2 with respect to the core material 1 and the occupancy rate of the piezoelectric materials 2 to the surface of the core material 1 exist. Regarding the comparison of the performance of the piezoelectric coil 10 due to their structural differences, it cannot be evaluated simply using the deformation and generated force. It is because input electric energy Ue differs depending on the occupancy rate of the piezoelectric materials 2.

In view of this, mechanical energy Um stored by the piezoelectric coil 10 without load with respect to the input electric energy Ue was calculated on the basis of the deformation and generated force and energy conversion efficiency η was determined. Accordingly, the piezoresponse efficiency was compared and evaluated between the respective piezoelectric coils 10.

It should be noted that the energy conversion efficiency η was defined in accordance with the following equation.

$$\eta = Um/Ue = (F\Delta x/2)/(CV^2/2)$$

Where F denotes generated force, $\Delta x$ denotes a displacement in the central axial direction of the coil, C denotes a free capacitance of the piezoelectric materials 2, and V denotes an applied voltage.

Figure 6:
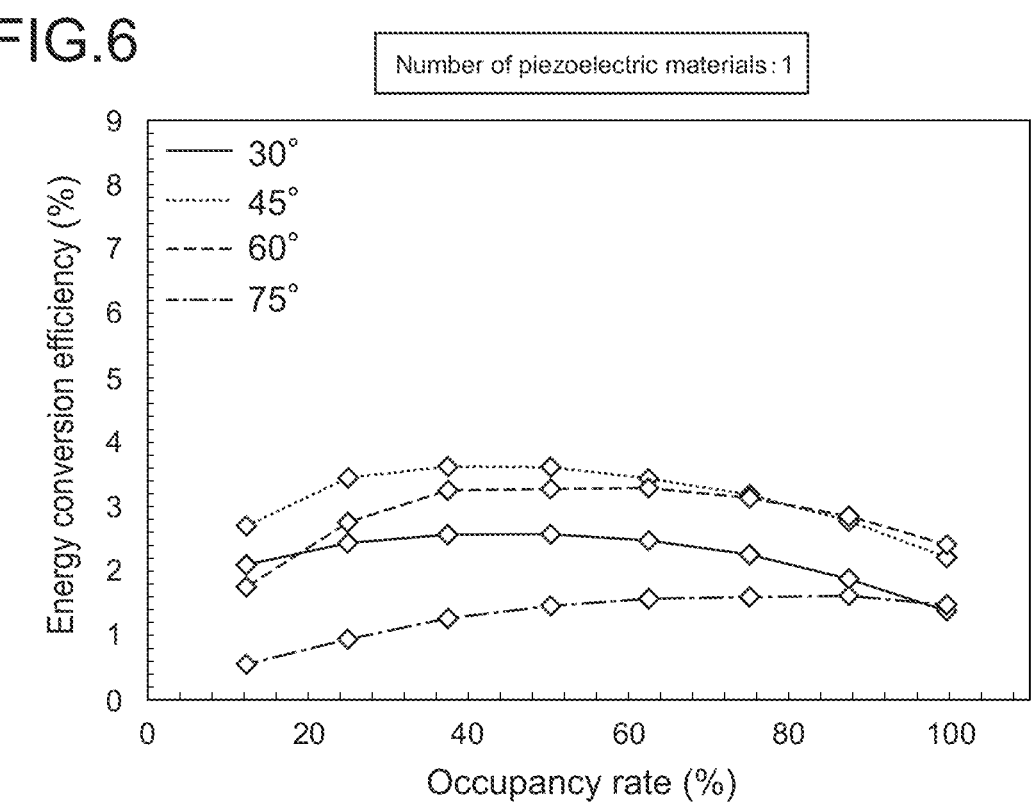
FIG. 6 A diagram showing a relationship between winding angle and occupancy rate of a piezoelectric coil according to a comparative example and energy conversion efficiency.
Figure 7:
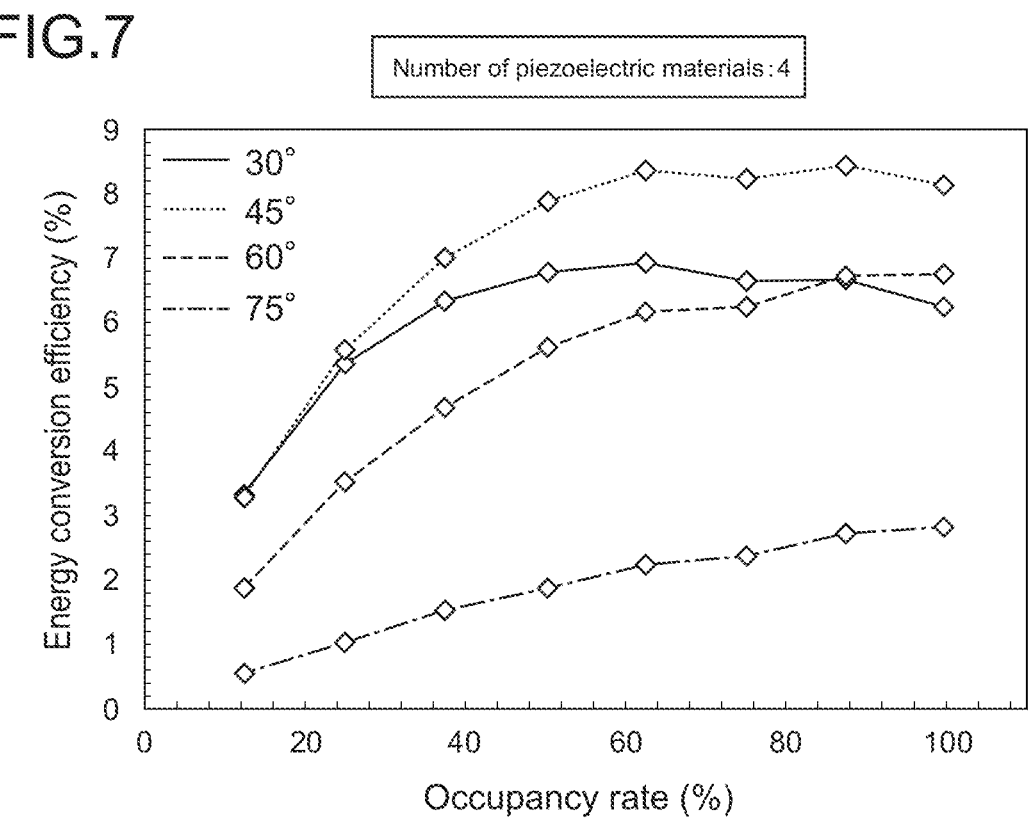
FIG. 7 A diagram showing a relationship between winding angle and occupancy rate in the piezoelectric coil according to the present embodiment and the energy conversion efficiency.

FIG. 6 is a diagram showing a relationship between the winding angle and occupancy rate and the energy conversion efficiency η in the piezoelectric coil 10' according to the comparative example (piezoelectric materials 2: single). FIG. 7 is a diagram showing a relationship between the winding angle and occupancy rate and the energy conversion efficiency η in the piezoelectric coil 10 according to the present embodiment (piezoelectric materials 2: four).

As it will be understood from the comparison in FIGS. 6 and 7, in a case where the same winding angle and the same occupancy rate are set in the piezoelectric coil 10' according to the comparative example (piezoelectric materials 2: single) and the piezoelectric coil 10 according to the present embodiment (piezoelectric materials 2: four), the energy conversion efficiency η of the piezoelectric coil 10 according to the present embodiment is obviously higher than the energy conversion efficiency η of the piezoelectric coil 10' according to the comparative example.

Moreover, with the piezoelectric coil 10' according to the comparative example (piezoelectric materials 2: single), the energy conversion efficiency η is about 3% at most even in a case where the winding angle and occupancy rate are adjusted. Meanwhile, with the piezoelectric coil 10 according to the present embodiment (piezoelectric materials 2: four), the energy conversion efficiency η is about 9% at most in a case where the winding angle and occupancy rate are adjusted. That is, with the piezoelectric coil 10 according to the present embodiment, the energy conversion efficiency η three times at most the maximum value of the energy conversion efficiency η of the piezoelectric coil 10' according to the comparative example can be obtained in a case where the winding angle and occupancy rate are suitably adjusted.

Here, in either case of the piezoelectric coil 10' according to the comparative example and the piezoelectric coil 10 according to the present embodiment, the energy conversion efficiency η is maximized at the winding angle of 45 degrees. It corresponds to the fact that the orientation of main stress when the piezoelectric coil 10 extends and contracts is tilted by 45 degrees with respect to the length direction of the core material 1 (see the dotted line in FIG. 1).

Figure 8:
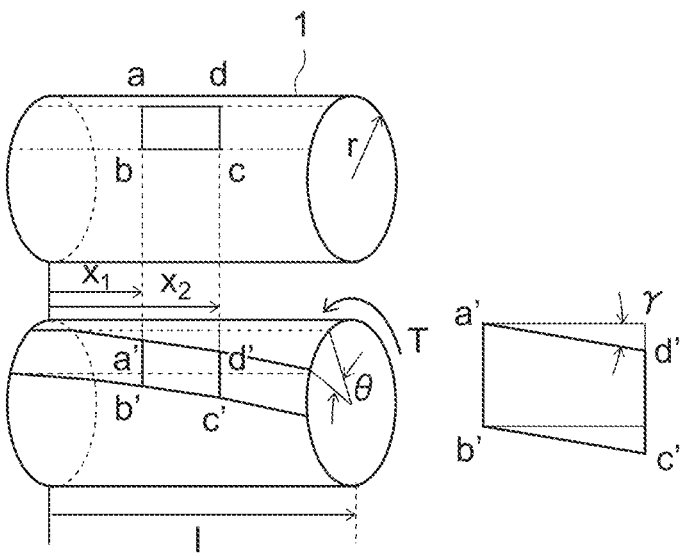
FIG. 8 A diagram showing a state when a torsion moment is generated by the piezoelectric materials with respect to the core material.
Figure 9:
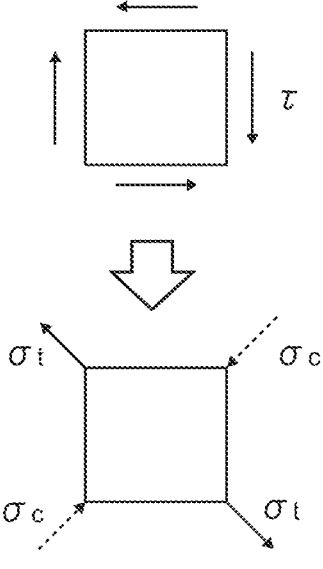
FIG. 9 A diagram showing minimum main stress and maximum main stress.

FIG. 8 is a diagram showing a state when a torsion moment T is generated by the piezoelectric materials 2 with respect to the core material 1. FIG. 9 is a diagram showing minimum main stress and maximum main stress.

On the upper side of FIG. 8, a state when the torsion moment T is not generated with respect to the core material 1 (without load) is shown. In the lower side of FIG. 8, a state when the torsion moment T is generated with respect to the core material 1 (with load) is shown. It should be noted that in FIG. 8, it is provided that a left end surface is a fixed surface.

Here, on the surface of the core material 1 without load, four apexes of a rectangle having two sides parallel to the length direction of the core material 1 are denoted by a, b, c, and d, respectively. Moreover, on the surface of the core material 1 with load, points corresponding to a, b, c, and d are denoted by a', b', c', and d', respectively. Moreover, a distance from the left fixed surface to a, b, a', b' is denoted by $x_1$ and a distance from the left fixed surface to c, d, c', d' is denoted by $x_2$. Moreover, the radius of the core material 1 is denoted by r and the specific angle of twist (the angle of twist per unit length l of the core material 1) is denoted by θ.

In this case, $a\text{-}a' = rx_1\theta$, $b\text{-}b' = rx_1\theta$, $c\text{-}c' = rx_2\theta$, and $d\text{-}d' = rx_2\theta$ are established and shear strain γ is rθ. As shown in FIG. 9, shear stress τ due to the shear strain γ (τ=G×γ: G transverse elastic modulus) can be considered as perpendicular stress orthogonal to each other called maximum main stress (tensile stress) σt and minimum main stress (compressive stress) σc by suitable coordinates conversion.

The orientation of such main stress is tilted by 45 degrees with respect to the length direction of the core material 1. Thus, if force can be applied in the orientation of 45 degrees with respect to the length direction of the core material 1, torsional torque T can be ideally applied to the core material 1. From such a factor, it can be considered that the energy conversion efficiency $\eta$ is maximized when the winding angle of the piezoelectric material 2 is set to about 45 degrees.

Therefore, the winding angle of the piezoelectric material 2 with respect to the core material 1 is typically within a range of 45 degrees±x centered at 45 degrees. This x value is set to 25 degrees, 20 degrees, 15 degrees, 10 degrees, 5 degrees, or 0 degrees, for example. It should be noted that as shown in FIG. 7, the energy conversion efficiency $\eta$ in the winding angle is 30 degrees, 45 degrees, or 60 degrees is higher than the energy conversion efficiency $\eta$ in a case where the winding angle is 75 degrees, and therefore the winding angle is typically set to be within a range of 45 degrees±15 degrees.

Moreover, referring to FIG. 7, regarding the occupancy rate of the piezoelectric materials 2 to the surface of the core material 1, basically as its value becomes higher, the energy conversion efficiency $\eta$ becomes higher. Therefore, this occupancy rate is typically set to 20% or more, 30% or more, 40% or more, . . . , 90% or more, or the like. It should be noted that as shown in FIG. 7, in a case where the winding angle is 30 degrees, 45 degrees, or 60 degrees, the occupancy rate tends to be saturated at 60%, and therefore in a case where the winding angle is 45 degrees±15 degrees, the energy conversion efficiency r close to the maximum value can be obtained if the occupancy rate is set to 60% or more.

<Reason for Performance Improvement>

Next, a reason for improvement of the performance of the piezoelectric coil 10 (piezoresponse performance, energy conversion efficiency r) due to the plurality of piezoelectric materials 2 will be described.

Figure 10:
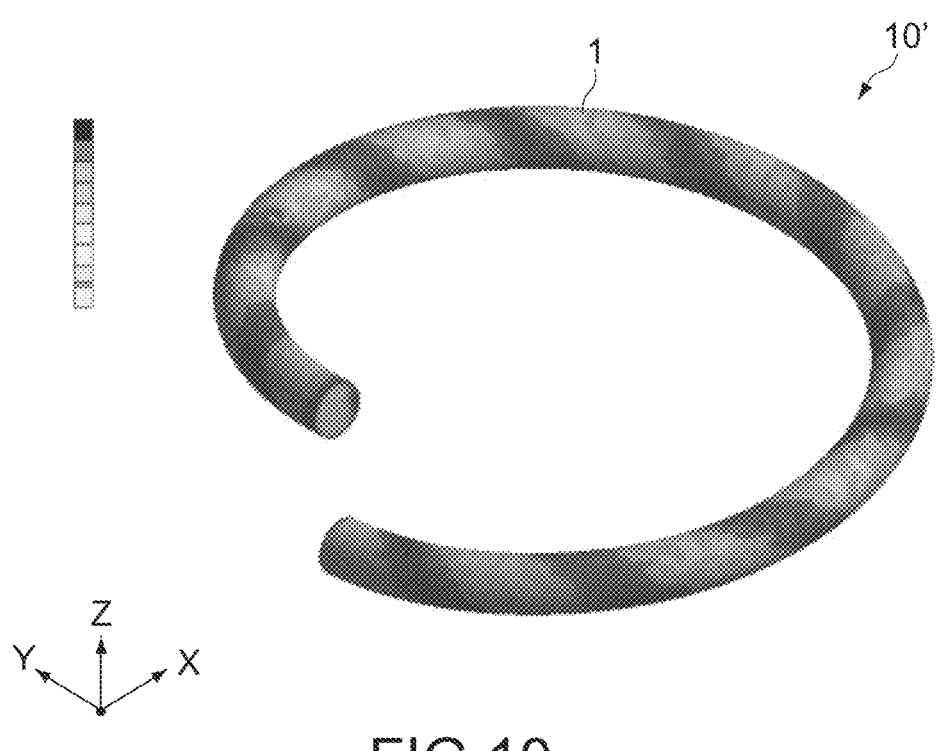
FIG. 10 A diagram showing a result of the numeric value simulation of the equivalent stress distribution on a surface of the core material in the piezoelectric coil according to the comparative example.
Figure 11:
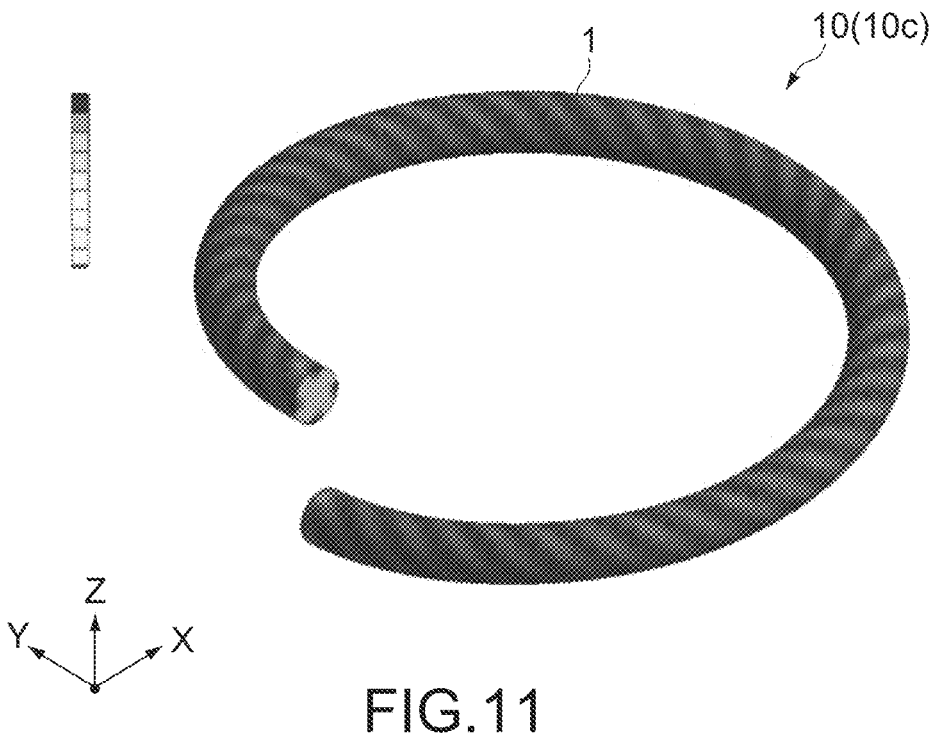
FIG. 11 A diagram showing a result of the numeric value simulation of the equivalent stress distribution on the surface of the core material in the piezoelectric coil according to the present embodiment.

FIG. 10 is a diagram showing a result of numeric value simulation of an equivalent stress distribution on the surface of the core material 1 in the piezoelectric coil 10' according to the comparative example (piezoelectric materials 2: single). FIG. 11 is a diagram showing a result of a numeric value simulation of an equivalent stress distribution on the surface of the core material 1 in the piezoelectric coil 10 according to the present embodiment (piezoelectric materials 2: four).

It should be noted that in FIGS. 10 and 11, the same grayscale is set for the equivalent stress distribution. Moreover, in the simulation in FIGS. 10 and 11, the same conditions as the conditions in the above-mentioned simulation were set as various conditions of the material for the core material 1, the material for the piezoelectric material 2, and the like.

It can be seen from the result of the simulation shown in FIGS. 10 and 11 that in either case of the piezoelectric coil 10' according to the comparative example and the piezoelectric coil 10 according to the present embodiment, generated stress is concentrated in regions between the piezoelectric materials 2 adjacent to each other.

Figure 12:
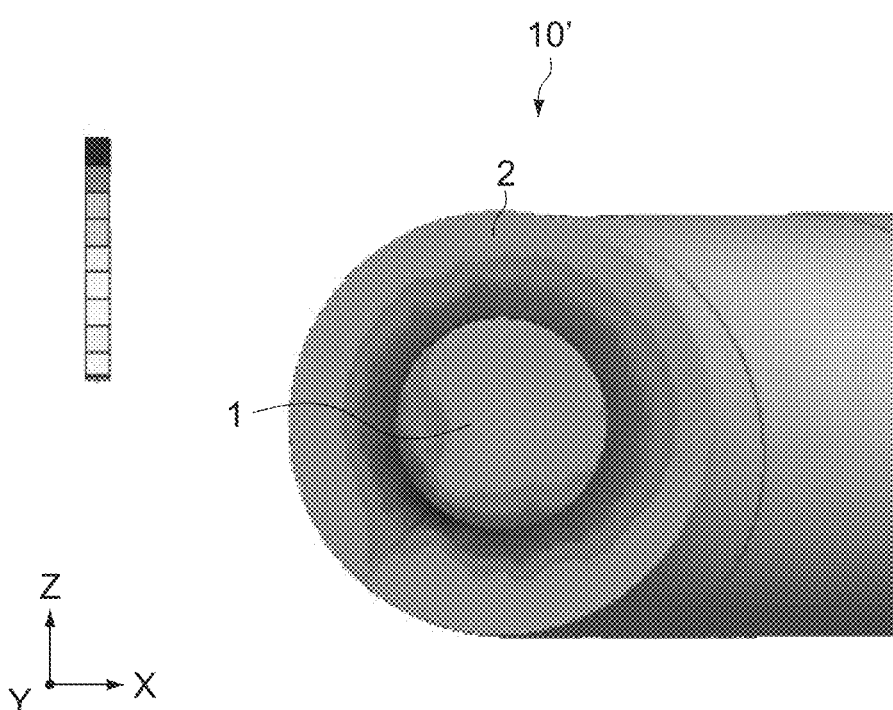
FIG. 12 A diagram showing a result of the numeric value simulation of the equivalent stress distribution on the cross-section of the core material in the piezoelectric coil according to the comparative example.
Figure 13:
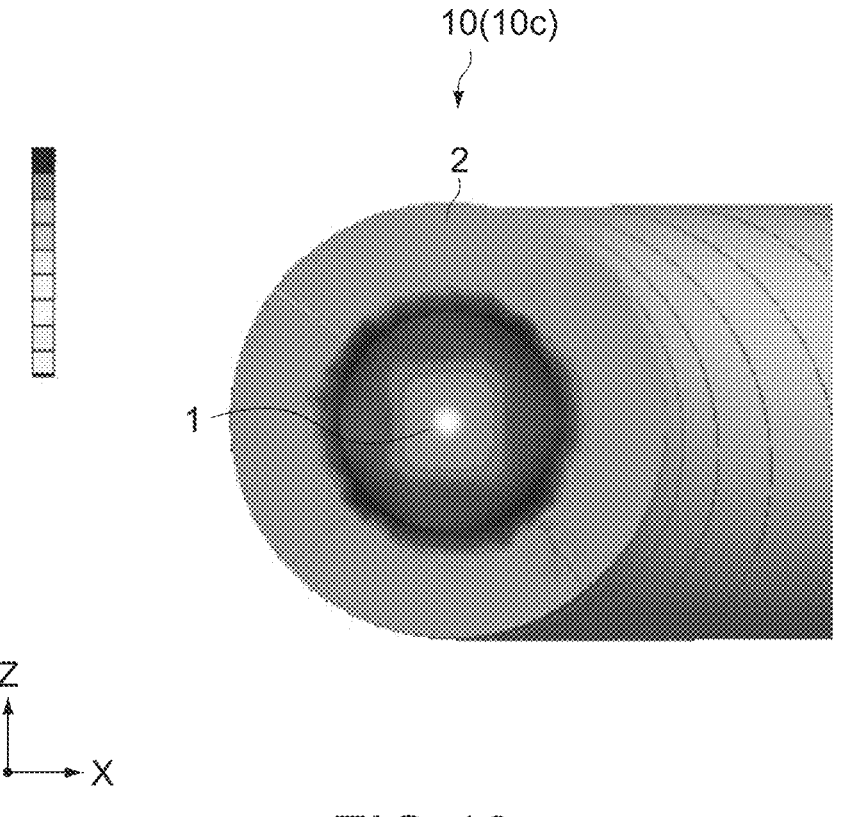
FIG. 13 A diagram showing a result of the numeric value simulation of the equivalent stress distribution on the cross-section of the core material in the piezoelectric coil according to the present embodiment.

FIG. 12 is a diagram showing a result of numeric value simulation of an equivalent stress distribution in the cross-section of the core material 1 in the piezoelectric coil 10' according to the comparative example (piezoelectric materials 2: single). FIG. 13 is a diagram showing a result of numeric value simulation of an equivalent stress distribution in the cross-section of the core material 1 in the piezoelectric coil 10 according to the present embodiment (piezoelectric materials 2: four).

It should be noted that in FIGS. 12 and 13, the same grayscale is set for the equivalent stress distribution. Moreover, in the simulation in FIGS. 12 and 13, the same conditions as the conditions in the above-mentioned simulation were set as various conditions of the material for the core material 1, the material for the piezoelectric material 2, and the like.

It can be seen from the simulation result shown in FIGS. 12 and 13 that in the piezoelectric coil 10 according to the present embodiment (piezoelectric materials 2: four), stress is generated uniformly symmetrically with respect to the center of the core material 1 as compared to the piezoelectric coil 10' according to the comparative example (piezoelectric materials 2: single). Moreover, it can be seen that in the piezoelectric coil 10 according to the present embodiment, strong stress is generated deeply inside the core material 1 as compared to the piezoelectric coil 10' according to the comparative example. Thus, in the present embodiment, as compared to the comparative example, the area in which the force of the piezoelectric materials 2 effectively acts on the surface of the core material 1 increases.

Therefore, it can be considered that with the piezoelectric coil 10 according to the present embodiment, the performance (piezoresponse performance, energy conversion efficiency r) is improved as compared to the piezoelectric coil 10' according to the comparative example.

<Number of Piezoelectric Materials 2>

Figure 14:
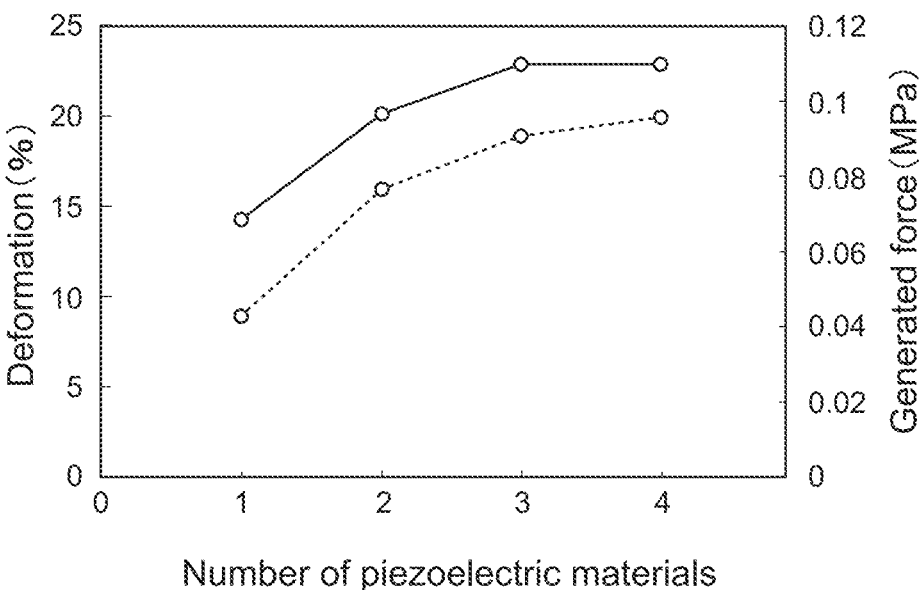
FIG. 14 A diagram showing a result of the numeric value simulation showing a relationship between the number of piezoelectric materials and deformation and generated force.
Figure 15:
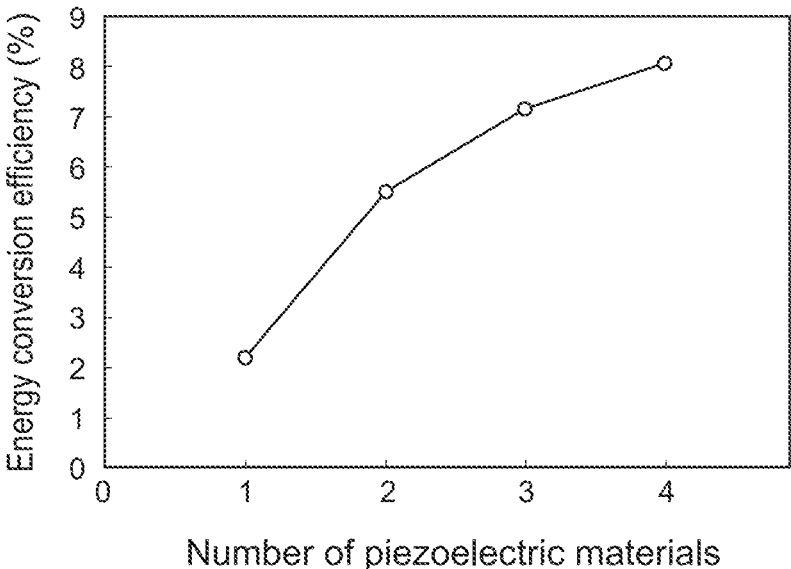
FIG. 15 A diagram showing a result of the numeric value simulation showing a relationship between the number of piezoelectric materials and the energy conversion efficiency.

Next, a suitable number for piezoelectric materials 2 (number of divisions of the piezoelectric material 2) will be described. FIG. 14 is a diagram showing a result of the numeric value simulation showing a relationship between the number of piezoelectric materials 2 and the deformation and generated force. In FIG. 14, the dotted line graph is a graph corresponding to the deformation and the solid line graph is a graph corresponding to the generated force. FIG. 15 is a diagram showing a result of the numeric value simulation showing a relationship between the number of piezoelectric materials 2 and the energy conversion efficiency $\eta$.

In the simulation in FIGS. 14 and 15, the same conditions as the conditions in the above-mentioned simulation were set as various conditions of the material for the core material 1, the material for the piezoelectric material 2, and the like.

It can be seen that as the number of piezoelectric materials 2 increases, the deformation and generated force tend to increase as shown in FIG. 14. On the other hand, it can be considered that in a case were the number of piezoelectric materials 2 is about four, the deformation and generated force tend to be saturated, and also in a case where the number of piezoelectric materials 2 is five or more, a great performance improvement in the deformation and generated force cannot be expected.

Moreover, it can be seen that as the number of piezoelectric materials 2 increases, the energy conversion efficiency $\eta$ tends to increase as shown in FIG. 15. On the other hand, it can be considered that in a case were the number of piezoelectric materials 2 is about four, the energy conversion efficiency $\eta$ tends to be saturated, and also in a case where the number of piezoelectric materials 2 is five or more, a great performance improvement in the energy conversion efficiency $\eta$ cannot be expected.

For the above-mentioned reason, the number of piezoelectric materials 2 is typically set to range from 2 to 10, from 2 to 7, from 3 to 5, or the like.

<Relationship between Young's Modulus of Core Material 1 and Young's Modulus of Piezoelectric Materials 2>

Next, a relationship between the Young's modulus of the material used for the core material 1 and the Young's modulus of the material used for the piezoelectric materials 2 will be described.

In this evaluation, first of all, six kinds of materials of graphite, Mg alloy, Al, Ti, SUS301, and W were selected as the material for the core material 1. The six kinds of materials were selected from the perspective of satisfying two conditions of a condition that it can be used as the electrode (has relatively high electrical conductivity) and a condition that the Young's modulus is relatively different from that of other materials.

Here, since the Young's modulus of the six kinds of materials differs, the softness of the entire piezoelectric coil 10 differs. Therefore, the performance of the respective piezoelectric coils 10 cannot be compared in view of the deformation and generated force. Therefore, the energy conversion efficiency η of the piezoelectric coil 10 when each material was used as the core material 1 was used as a physical quantity to be evaluated.

Figure 16:
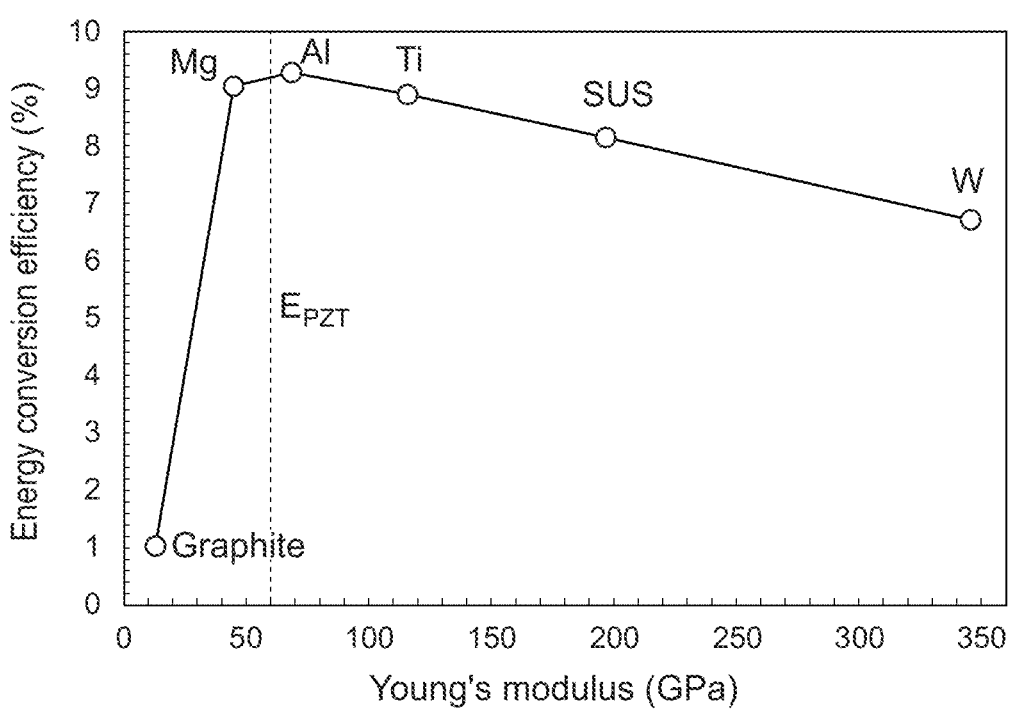
FIG. 16 A diagram showing a result of the numeric value simulation showing a relationship between a Young's modulus of the core material and the energy conversion efficiency.

FIG. 16 is a diagram showing a result of the numeric value simulation showing a relationship between the Young's modulus of the core material 1 and the energy conversion efficiency η. In the simulation in FIG. 16, the same conditions as the conditions in the above-mentioned simulation were set as various conditions of the material for the core material 1, the material for the piezoelectric material 2, and the like.

From the result shown in FIG. 16, it has been found that the energy conversion efficiency η is maximized when Al was used as the material for the core material 1. In addition, at this time, focusing on a Young's modulus $E_{PZT}$ of PZT that is the material used for the piezoelectric materials 2, it has been found from the calculation result that when the Young's modulus of the material used for the core material 1 equals the Young's modulus of the material used for the piezoelectric materials 2, the energy conversion efficiency η takes a maximum value.

A qualitative description as this factor will be made. If the core material 1 is too soft, the item of the force in the work=the force×the amount of movement decreases. As a result, the work that the piezoelectric materials 2 apply to the core material 1 decreases, and the extension and contraction efficiency of the piezoelectric coil 10 lowers. On the contrary, if the core material 1 is too hard, the item of the amount of movement decreases, and the extension and contraction efficiency of the coil lowers also in this case. That is, it can be considered that setting the Young's modulus of the core material 1 and the Young's modulus of the piezoelectric materials 2 to be equal maximizes the work applied to the core material 1 from the piezoelectric materials 2.

It should be noted that as shown in FIG. 16, in a case where the Young's modulus of the core material 1 is higher than the Young's modulus of the piezoelectric materials 2, the energy efficiency tends to relatively gently lower. On the other hand, in a case where the Young's modulus of the core material 1 is lower than the Young's modulus of the piezoelectric materials 2, the energy conversion efficiency η tends to relatively sharply lower.

Therefore, the Young's modulus of the core material 1 is typically set to range from −60% to +500%, from −55% to +400%, from −50% to +300%, from −45% to +200%, from −40% to +100%, or the like with respect to the Young's modulus of the piezoelectric materials 2.

<Power Generation Element>

Hereinabove, the case where the piezoelectric coil 10 is used as a piezoelectric actuator using the inverse piezoelectric effect of the piezoelectric materials 2 has been mainly described. On the other hand, in the description here, a case where the piezoelectric coil 10 is used as a power generation element using the direct piezoelectric effect of the piezoelectric materials 2 will be described. In a case where the piezoelectric coil 10 is used as a power generation element, the electrode portion 5 is used as an electrode for extracting electric power generated by extension and contraction of the piezoelectric materials 2.

Moreover, in the description here, a case where the piezoelectric coil 10 (power generation element) is used as an energy harvester will be described. It should be noted that the piezoelectric coil 10 (power generation element) can also be applied to applications other than the energy harvester as a matter of course, and typically can be used in any application as long as it is for generating electric power in accordance with movement of an object.

In a case where the piezoelectric coil 10 is used as an energy harvester, the piezoelectric coil 10 is placed in a movable portion such as a joint of an animal including a human being, for example, and part of work produced by a living body muscle M is extracted as electric power. That is, the piezoelectric coil 10 generates electric power by extending and contracting in accordance with the movement of the animal. The power generation efficiency at this time depends on a ratio of the Young's modulus of the piezoelectric coil 10 to the Young's modulus of the living body muscle M that is an operating source for the piezoelectric coil 10. Hereinafter, it will be described.

For generalization, effective lengths (Z-axis direction) and cross-sectional areas (XY-plane) of the living body muscle M and the piezoelectric coil 10 are normalized, and considerations will be made using deformation (displacement amount) per unit length and force per unit cross-sectional area. Here, an energy harvesting mechanism based on the motion of the living body muscle M is modelled as a parallel-connection spring of the living body muscle M and the piezoelectric coil 10.

Figure 17:
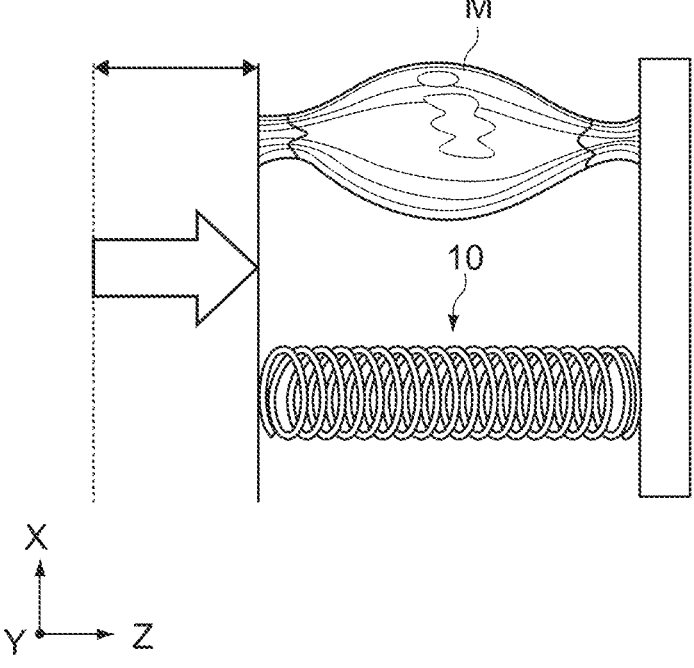
FIG. 17 A diagram showing a state when an energy harvesting mechanism is modelled as a parallel-connection spring of a living body muscle and a piezoelectric coil.

FIG. 17 is a diagram showing a state when the energy harvesting mechanism is modelled as the parallel-connection spring of the living body muscle M and the piezoelectric coil 10.

Here, why the living body muscle M and the piezoelectric coil 10 is modelled as the parallel-connection spring is that the deformation (displacement amount) of the living body muscle M and the piezoelectric coil 10 is equal in a case where the piezoelectric coil 10 is installed with respect to a movable portion of the body surface. The generated electric energy at this time is proportional to mechanical work $W_{COIL\text{-}MUSCLE}$ per unit volume from the living body muscle M to the piezoelectric coil 10.

Here, the Young's modulus of the living body muscle M, the maximum deformation, and the maximum generated force per unit cross-sectional area are denoted by $E_{MUSCLE}$, $\varepsilon_{MAX}$, and $\sigma_{MUSCLE}$, respectively. Moreover, the Young's modulus of the piezoelectric coil 10 is denoted by $E_{COIL}$. The mechanical work $W_{COIL\text{-}MUSCLE}$ when the living body muscle M reaches the maximum deformation from zero displacement is represented by Equation (1) below.

$$W_{COIL\text{-}MUSCLE} = E_{COIL}\varepsilon_{MAX}^{2}/2 \qquad (1)$$

Moreover, when the living body muscle M and the piezoelectric coil 10 are connected in parallel, the maximum generated force per unit cross-sectional area $\sigma_{MUSCLE}$ of the living body muscle M is represented by Equation (2) below with $E_{MUSCLE}$, $E_{COIL}$, and $\varepsilon_{MAX}$.

$$\sigma_{MUSCLE}=(E_{MUSCLE}+E_{COIL})\varepsilon_{MAX} \qquad (2)$$

Based on this Equation (2), Equation (1) is represented as follows in Equation (3).

$$W_{COIL\text{-}MUSCLE}=E_{COIL}\sigma_{MUSCLE}^{2}/\{2(E_{MUSCLE}+qaE\text{-}_{COIL})^{2}\} \qquad (3)$$

Here, $\sigma_{MUSCLE}$ can be considered as a constant because it is generated force derived from the original performance of the living body muscle M. Thus, $W_{COIL\text{-}MUSCLE}$ can be considered as the function of $E_{MUSCLE}/E_{COIL}$.

Figure 18:
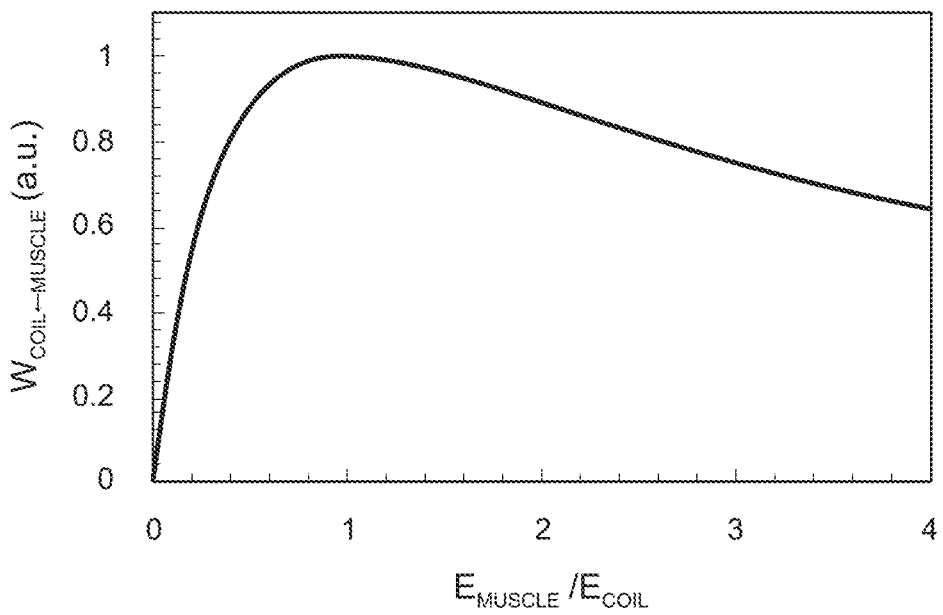
FIG. 18 A diagram showing a relationship between $W_{COIL-MUSCLE}$ and $E_{MUSCLE}/E_{COIL}$.

FIG. 18 is a diagram showing a relationship between $W_{COIL\text{-}MUSCLE}$ and $E_{MUSCLE}/E_{COIL}$. As it will be understood from FIG. 18, the mechanical work $W_{COIL\text{-}MUSCLE}$ per unit volume from the living body muscle M to the piezoelectric coil 10 is maximized when the Young's modulus $E_{MUSCLE}$ of the living body muscle M equals the Young's modulus $E_{COIL}$ of the piezoelectric coil 10. That is, it can be seen that when the Young's modulus $E_{MUSCLE}$ of the living body muscle M equals the Young's modulus $E_{COIL}$ of the piezo-electric coil 10, the work of the living body muscle M is transmitted to the piezoelectric coil 10 most efficiently and the piezoelectric coil 10 generates electric power efficiently.

Here, it is generally considered that as to biological tissues associated with the indirect motion, the Young's modulus of a muscle cell is about 10 kPa and the Young's modulus of a fasciae is 1 to 10 MPa. It is thus conceivable that an effective Young's modulus $E_{MUSCLE}$ of the living body muscle M ranges from 10 kPa to 10 MPa. It is thus conceivable that setting the Young's modulus $E_{COIL}$ of the piezoelectric coil 10 to range from 10 kPa to 10 MPa can maximize the mechanical work $W_{COIL\text{-}MUSCLE}$ per unit volume from the living body muscle M to the piezoelectric coil 10.

That is, in a case where the piezoelectric coil 10 is used as an energy harvester that generates electric power in accordance with the movement of an animal, the Young's modulus $E_{COIL}$ of the piezoelectric coil 10 is typically set to range from 10 kPa to 10 MPa.

It should be noted that since the piezoelectric coil 10 according to the present embodiment originally has higher energy conversion efficiency η, in a case where the piezoelectric coil 10 is used as a power generation element, the piezoelectric coil 10 is capable of generating higher electric power with a small displacement amount (deformation).

<Electronic Apparatus>

The piezoelectric coil 10 (piezoelectric actuator, power generation element) according to the present embodiment can be mounted on a variety of electronic apparatuses. For example, the piezoelectric coil 10 may be used as a drive system for a micro-pump, a camera focus, an inkjet printer, a microscope stage, a displacement magnification mecha-nism, or the like or may be used as a car engine mount or a shock absorber of a car suspension. It should be noted that since an apparatus including the piezoelectric coil 10 according to the present embodiment is considered as an apparatus using electronics, any apparatus can be considered as an electronic apparatus according to the present technol-ogy.

Figure 19:
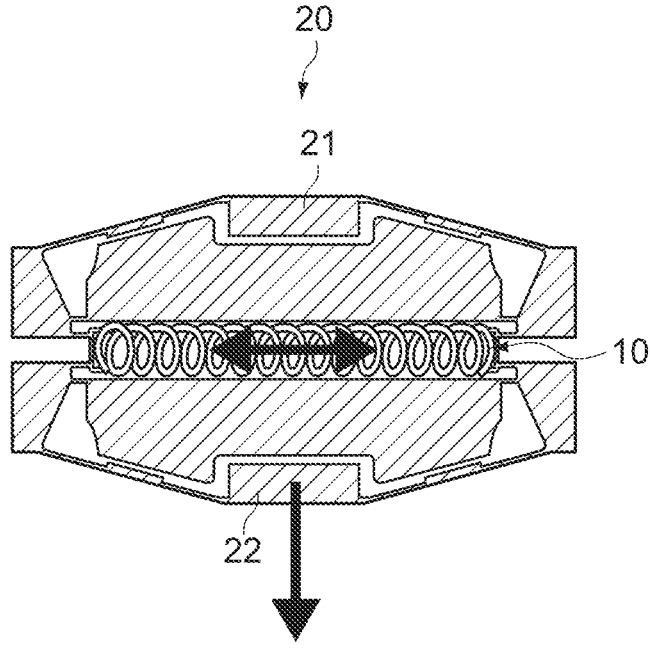
FIG. 19 A diagram showing an example in a case where the piezoelectric coil is mounted on a lever-type displacement magnification apparatus.

FIG. 19 is a diagram showing an example in a case where the piezoelectric coil 10 is mounted on a lever-type dis-placement magnification apparatus 20. The lever-type dis-placement magnification apparatus 20 includes the piezo-electric coil 10, a fixed portion 21, and an output unit 22. The output unit 22 magnifies and outputs the extension and contraction of the piezoelectric coil 10 in a direction orthogonal to the extension and contraction direction of the piezoelectric coil 10, using the principle of leverage. Since the piezoelectric coil 10 according to the present embodi-ment originally has a large displacement amount (deforma-tion), greater output can be obtained at the output unit 22 even in a case where the displacement magnification appa-ratus 20 is downsized.

<Actions, Etc.>

As described above, the piezoelectric coil 10 according to the present embodiment includes the coil-like core material 1 and the plurality of band-like piezoelectric materials 2 helically wound around the core material 1 so as to be alternately arranged along the core material 1. Since the number of piezoelectric materials 2 is plural in the piezo-electric coil 10 according to the present embodiment, the deformation (displacement amount) and the generated force of the entire piezoelectric coil 10 can be increased as compared to the piezoelectric coil 10' according to the comparative example (piezoelectric materials 2: single). Moreover, the piezoelectric coil 10 according to the present embodiment is capable of improving the energy conversion efficiency η as compared to the piezoelectric coil 10' accord-ing to the comparative example.

Moreover, in the piezoelectric coil 10 according to the present embodiment, the energy conversion efficiency η can be further improved by setting the number of piezoelectric materials 2 to be a suitable number (e.g., range from 2 to 10, from 2 to 7, from 3 to 5).

Moreover, in the piezoelectric coil 10 according to the present embodiment, the energy conversion efficiency η can be improved by setting the winding angle of the piezoelec-tric materials 2 with respect to the core material 1 to be a suitable angle (e.g., 45 degrees±x: x=25 degrees, 20 degrees, 15 degrees, 10 degrees, 5 degrees, 0 degrees).

Moreover, in the piezoelectric coil 10 according to the present embodiment, the energy conversion efficiency η can be further improved by setting the occupancy rate of the piezoelectric materials 2 to the surface of the core material 1 to be a suitable value (e.g., 20% or more, 30% or more, 40% or more, . . . , 90% or more).

Moreover, in the piezoelectric coil 10 according to the present embodiment, the energy conversion efficiency η can be further improved by setting the Young's modulus of the core material 1 to be a suitable value (e.g., range from −60% to +500%, from −55% to +400%, from −50% to +300%, from −45% to +200%, from −40% to +100%) with respect to the Young's modulus of the piezoelectric materials 2.

Moreover, in the piezoelectric coil 10 according to the present embodiment, in a case where the piezoelectric coil 10 is used as an energy harvester that is installed in a joint or the like, power generation can be efficiently performed by setting the Young's modulus of the piezoelectric coil 10 to be a suitable value (range from 10 kPa to 10 MPa).

Moreover, in the piezoelectric coil 10 according to the present embodiment, a strong electric field can be applied on the piezoelectric materials 2 when the piezoelectric materi-als 2 are sandwiched between the core material 1 (or the back electrode) and the surface electrodes 6 in a case of an embodiment in which the piezoelectric coil 10 is a piezo-electric actuator. Moreover, in a case where the piezoelectric coil 10 is a power generation element, it is possible to efficiently extract electric power from the piezoelectric materials 2.

Moreover, in the piezoelectric coil 10 according to the present embodiment, in a case where the core material 1 functions as a part of the electrode portion 5, it is not specially necessary to provide the piezoelectric coil 10 with the back electrode and the like, and therefore the configuration of the electrode portion 5 can be simplified.

Moreover, in a case where the piezoelectric coil 10 according to the present embodiment is used as a piezoelectric actuator, higher output (displacement amount (deformation), generated force) can be obtained with a small applied voltage because the energy conversion efficiency η is higher. Moreover, in a case where the piezoelectric coil 10 according to the present embodiment is used as a power generation element, higher electric power can be obtained with a small displacement amount (deformation) because the energy conversion efficiency η is higher.

Figure 20:
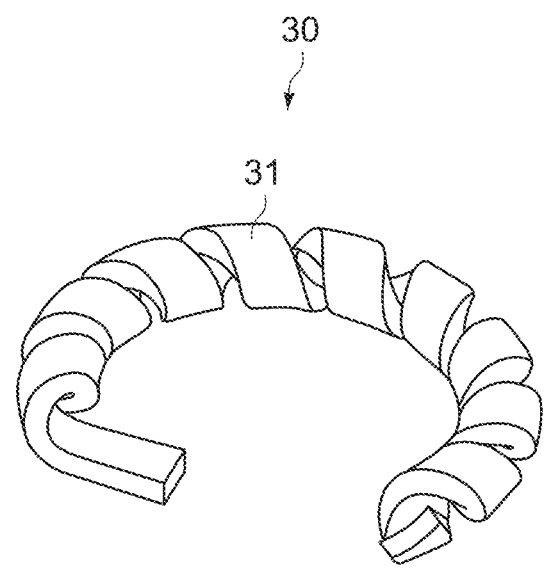
FIG. 20 A diagram showing a piezoelectric actuator according to another comparative example.

FIG. 20 is a diagram showing a piezoelectric actuator 30 according to another comparative example. This piezoelectric actuator 30 is configured by bending a single piezoelectric material 2 in a helical form without the core material 1. Therefore, the piezoelectric actuator 30 has problems in that the piezoelectric actuator 30 is fragile to external force, has a short lifetime, can be damaged during transportation, and so on. In contrast, since the piezoelectric coil 10 according to the present embodiment does not have these problems because of the core material 1.

Various Modified Examples

Another Example of Electrode Portion

Figure 21:
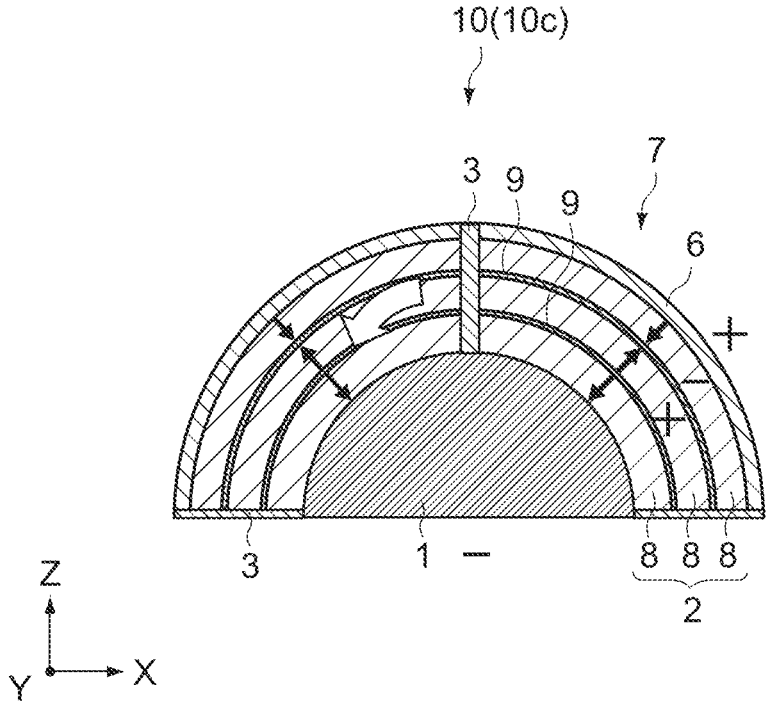
FIG. 21 A diagram showing another example of the electrode portion.

Next, another example of the electrode portion will be described. FIG. 21 is a diagram showing another example of the electrode portion. It should be noted that FIG. 21 partially shows a half of the cross-section of the piezoelectric coil 10. As shown in FIG. 21, an electrode portion 7 includes a core material 1, a surface electrode 6, and two internal electrodes 9. Moreover, in this case, piezoelectric materials 2 are divided in the thickness directions of the piezoelectric materials 2, and the piezoelectric materials 2 include a plurality of piezoelectric layers 8 stacked via the internal electrodes 9 in the thickness directions. Moreover, the internal electrodes 9 are each interposed between the piezoelectric layers 8.

Although in the example shown in FIG. 21, the number of internal electrodes 9 is two, the number of internal electrodes 9 is not particularly limited as long as the number of internal electrodes 9 is one or more. Moreover, although in the example shown in FIG. 21, the number of piezoelectric layers 8 is three (the number of internal electrodes 9 plus one) because the number of internal electrodes 9 is two, the number of piezoelectric layers 8 is not particularly limited as long as the number of piezoelectric layers 8 is two or more.

For the core material 1, the internal electrodes 9, and the surface electrodes 6, positive electrodes or negative electrodes are allocated so that the positive electrodes and the negative electrodes are alternately arranged in a radial direction. The internal electrodes 9 are constituted by a variety of materials (e.g., metal) having relatively high electrical conductivity like the surface electrodes 6.

For example, such a piezoelectric coil 10 including the internal electrodes 9 and the surface electrodes 6 is, for example, produced in the following manner. First of all, the internal electrode 9 is formed on a surface of the piezoelectric layer 8 by vapor deposition, sputtering, coating, or the like, and a necessary number of piezoelectric layers 8 having the internal electrode 9 formed thereon are prepared. Moreover, the surface electrodes 6 are formed on the surface of the piezoelectric layers 8 by vapor deposition, sputtering, coating, or the like, and the piezoelectric layers 8 having the surface electrodes 6 formed thereon is prepared.

Then, after a necessary number of piezoelectric layers 8 having the internal electrodes 9 formed thereon are stacked, the piezoelectric layers 8 having the surface electrodes 6 formed thereon is stacked on the uppermost surface side. Then, this stack is helically wound around the core material 1. Therefore, the internal electrodes 9 are typically in a helical form with respect to the core material 1. It should be noted that insulating portions 3 are each interposed between the internal electrodes 9 adjacent to each other in the length direction of the core material 1.

In a case of an embodiment in which the internal electrodes 9 are provided as shown in FIG. 21, the distance between the electrodes is shorter. Thus, in a case where the piezoelectric coil 10 is used as a piezoelectric actuator, much greater output (displacement amount (deformation), generated force) can be obtained even with a small applied voltage. Moreover, in a case where the piezoelectric coil 10 is used as a power generation element, much higher electric power can be obtained with a small displacement amount (deformation).

Still Another Example of Electrode Portion

Hereinabove, the case where the electric field is applied in the thickness directions of the piezoelectric materials 2 has been described. On the other hand, the electric field may be applied in the length direction of the piezoelectric material 2.

Figure 22:
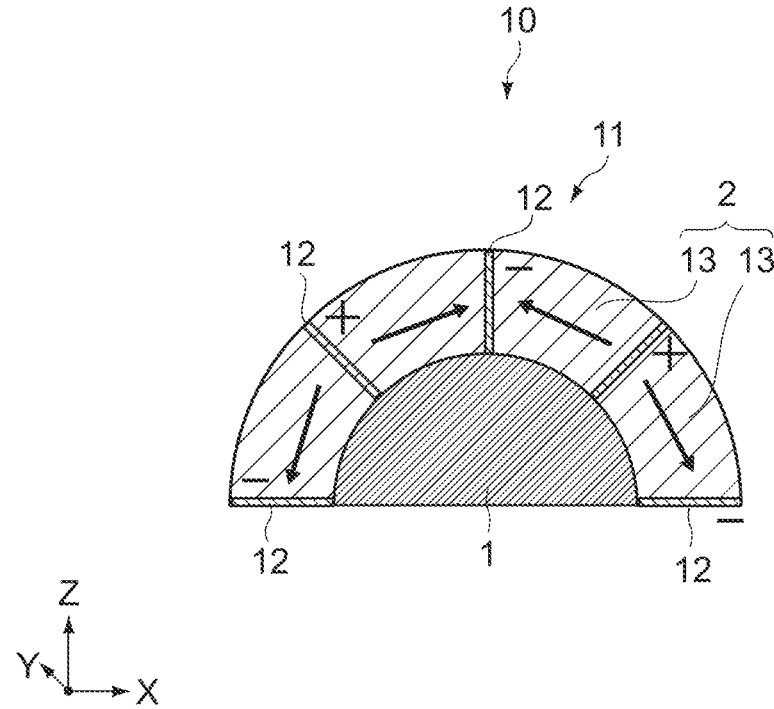
FIG. 22 A diagram showing an example of the electrode portion in a case where an electric field is applied in a length direction of the piezoelectric material.

FIG. 22 is a diagram showing an example of an electrode portion 11 in a case where an electric field is applied in the length direction of the piezoelectric material 2. It should be noted that the cross-section shown in FIG. 22 is a cross-section along the helical shape of the piezoelectric materials 2 (i.e., it is not a cross-section orthogonal to the length direction of the core material) and FIG. 22 partially shows a half of the cross-section.

As shown in FIG. 22, the electrode portion 11 includes a plurality of internal electrodes 12 arranged at predetermined intervals in the length direction of the piezoelectric material 2. The piezoelectric materials 2 are divided in the length direction of the piezoelectric material 2 and includes a plurality of piezoelectric layers 13 stacked via the internal electrodes 12 in the length direction.

The internal electrodes 12 are constituted by a variety of materials (e.g., metal) having relatively high electrical conductivity. Moreover, for the internal electrodes 12, positive electrodes or negative electrodes are allocated so that the positive electrodes and the negative electrodes are alternately arranged in the length direction of the piezoelectric material 2.

For example, such a piezoelectric coil 10 including the internal electrodes 12 is, for example, produced in the following manner. First of all, the internal electrode 12 is formed on one side surface of the piezoelectric layer 12 by vapor deposition, sputtering, coating, or the like, and a necessary number of piezoelectric layers 13 having the internal electrodes 12 formed thereon are prepared.

Then, a stack is formed by stacking a necessary number of piezoelectric layers 13 having the internal electrodes 12 formed thereon in the length direction of the piezoelectric material 2, and this stack is helically wound around the core material 1. It should be noted that the insulating portions 3 are each interposed between the internal electrodes 12 adjacent to each other in the length direction of the core material 1.

It should be noted that in a case of an embodiment in which an electric field is applied in the length direction of the piezoelectric material 2, it is unnecessary to provide the surface electrodes 6, and the core material 1 is constituted by an insulating material or the insulating layer is formed on the surface of the core material 1.

In the case of the embodiment in which an electric field is applied in the length direction of the piezoelectric material 2, although the configuration of the electrode portion 11 is more complicated than that in an embodiment in which an electric field is applied in the thickness directions of the piezoelectric materials 2, the piezoelectric performance efficiency is improved because the direction of the electric field applied on the piezoelectric materials 2 is identical to the extension and contraction direction of the piezoelectric materials 2 that contributes to the deformation of the piezoelectric coil 10. Therefore, larger deformation can be obtained. Moreover, it is also advantageous for a case where piezoelectric materials that largely extend and contract especially in the direction of the electric field are used.

<Bending Mechanism>

Figure 23:
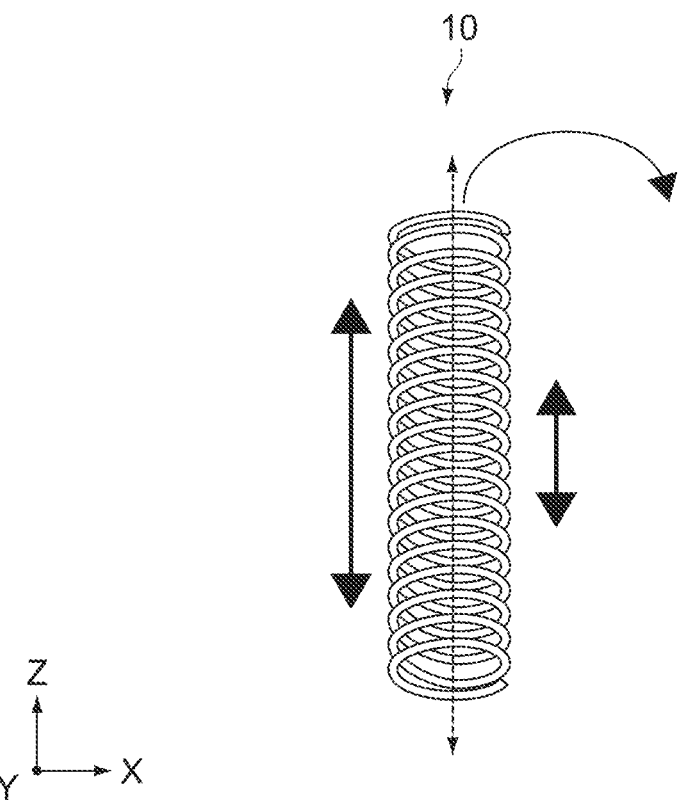
FIG. 23 A diagram showing a state when the piezoelectric coil is bent by a bending mechanism in a direction other than a direction of a center axis.

The piezoelectric coil 10 may include a bending mechanism that bends the piezoelectric coil 10 in a direction other than a direction of a coil center axis (see the dotted line in FIG. 1). FIG. 23 is a diagram showing a state when the bending mechanism bends the piezoelectric coil 10 in the direction other than the direction of the center axis.

The bending mechanism may be, for example, a support or the like fixed to the side of the piezoelectric coil 10 to be bent. Alternatively, the bending mechanism can also be realized by configuring the electrode portion 5, 7, 11 to have a special structure or can also be realized by setting the applied voltage non-uniformly for the side to be bent and the opposite side.

<Supplements>

Out of the plurality of piezoelectric materials 2 helically wound, some piezoelectric materials 2 may be used as extending and contracting piezoelectric materials for the extension and contraction of the piezoelectric coil 10 and the other piezoelectric materials 2 may be used as piezoelectric materials for detection for detecting the degree of extension and contraction of the piezoelectric coil 10. Information detected by the detection piezoelectric materials is used as information for feed-back control, for example. In this case, the materials used as the extending and contracting piezoelectric materials may be different from the materials used as the detection piezoelectric materials.

Second Embodiment

Figure 24:
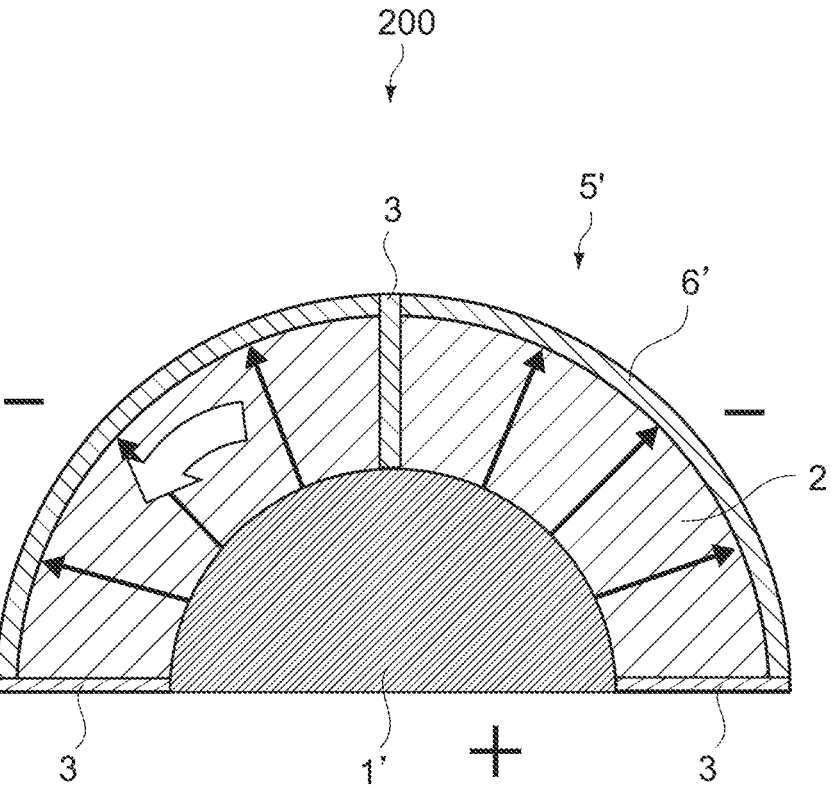
FIG. 24 A cross-sectional view of a piezoelectric coil according to the second embodiment.
Figure 24:
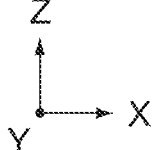

FIG. 24 is a cross-sectional view of a piezoelectric coil 200 according to a second embodiment of the present technology. Hereinafter, configurations different from those of the first embodiment will be mainly described, configurations similar to those of the first embodiment will be denoted by similar reference signs, and descriptions thereof will be omitted or simplified.

The present embodiment is different from the first embodiment in that as shown in FIG. 24, surface electrodes 6' (second electrode) are provided on the surfaces of the piezoelectric materials 2 and are ground electrodes (negative electrodes) opposite to a core material 1' (first electrode) in the radial direction (thickness directions of the piezoelectric materials 2). The core material 1' have two functions of a function as a coil spring as in the first embodiment and a function as a part (first electrode) of an electrode portion 5'. Moreover, a material having relatively high electrical conductivity (e.g., graphite, Mg alloy, metal such as Al, Ti, SUS, W, Au, Ag, Cu, and Pt) is used as a material for the core material 1'.

Moreover, as in the first embodiment, specially an electrode layer (first electrode) may be formed on a surface of the core material 1' by vapor deposition, sputtering, coating, or the like.

Moreover, the surface electrodes 6' are ground potentials and examples of a material for the surface electrodes 6' can include the materials described above in the first embodiment. The surface electrodes 6' are provided in a layer form to cover the entire surfaces of the piezoelectric materials 2 on the surfaces of the piezoelectric materials 2.

In the present embodiment, the surface electrodes 6' of the piezoelectric coil 200 are connected to the ground potential and apply a signal voltage on the core material 1'. Accordingly, the core material 1' on which voltage is applied is covered with the insulative piezoelectric object, and voltage is not applied on the surface electrodes 6' of the piezoelectric coil 200, which can be touched directly, and therefore it is advantageous as measures against electric shock or electricity leakage.

Third Embodiment

Figure 25:
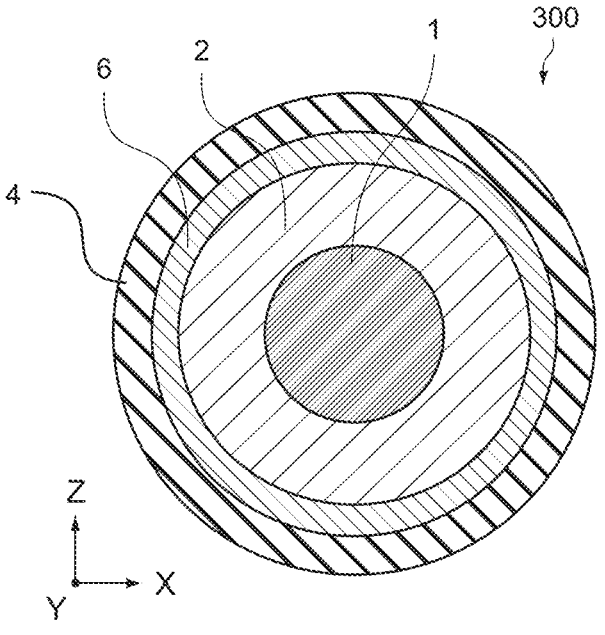
FIG. 25 (A) is a cross-sectional view of a piezoelectric coil according to a third embodiment and (B) is a cross-sectional view of a modified example of the piezoelectric coil according to the third embodiment.
Figure 25:
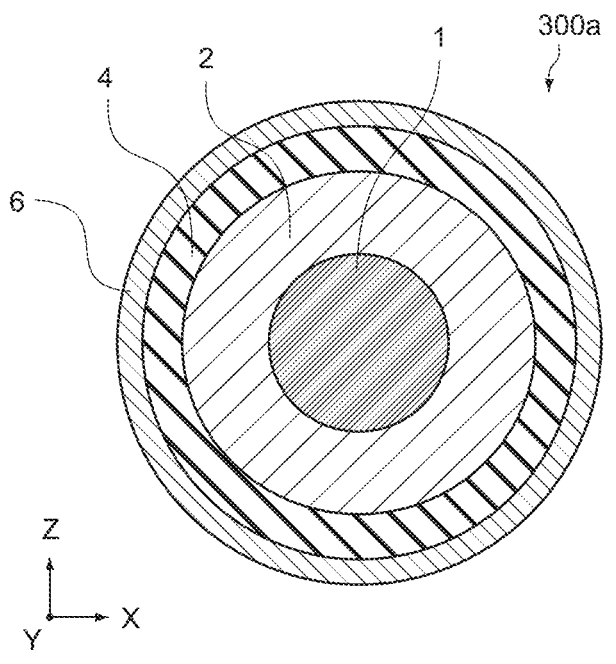

FIG. 25 (A) is a cross-sectional view of a piezoelectric coil 300 according to a third embodiment of the present technology. Hereinafter, configurations different from those of the first embodiment will be mainly described, configurations similar to those of the first embodiment will be denoted by similar reference signs, and descriptions thereof will be omitted or simplified.

The present embodiment is different from the first embodiment in that a resin layer 4 that covers the surfaces of the plurality of piezoelectric materials 2 is further provided. In FIG. 25 (A), the resin layer 4 is provided on the outer periphery of the surface electrodes 6 located on the outer peripheral side of the piezoelectric materials 2 and is in a layer form to cover the entire surfaces of the surface electrodes 6. Typically, an insulative material having softness relatively higher than that of the material used for the piezoelectric materials 2 is used as the material used for the resin layer 4. For example, vinyl resin, styrene resin, gel material, urethane resin, silicone resin, rubber resin, or the like can be employed. The resin layer 4 is formed on the surfaces of the surface electrodes 6 by dip or the like, for example, and is in a helical form with respect to the core material 1 as in the surface electrodes 6. It should be noted that the resin layer 4 may also be interposed between the piezoelectric materials 2 adjacent to each other in the length direction of the core material 1 (see the long dashed short dashed line in FIG. 1) or the insulating portions 3 (see FIG. 4) may be each interposed between the piezoelectric materials 2 adjacent to each other in the length direction of the core material 1 as in the first embodiment.

In the present embodiment, covering the piezoelectric materials 2 with the resin layer 4 protects the piezoelectric materials 2 from external impact and suppresses generation of cracks and growth of cracks. In addition, since the resin layer 4 is insulative and covers between the surface electrodes 6 and between the piezoelectric materials 2, discharge of electricity can be prevented and the reliability during voltage application can also be improved.

Modified Example

FIG. 25 (B) is a cross-sectional view of a piezoelectric coil 300*a* that is a modified example of the piezoelectric coil 300 according to the third embodiment. Hereinafter, configurations different from those of the third embodiment will be mainly described, configurations similar to those of the third embodiment will be denoted by similar reference signs, and descriptions thereof will be omitted or simplified.

The modified example of the third embodiment is different from the third embodiment in that the surface electrodes 6 (second electrode) are provided on the surfaces of the piezoelectric materials 2 in opposite to the core material 1 (first electrode) in the thickness direction (radial direction) and the piezoelectric coil 300a includes a resin layer 4a arranged between the piezoelectric materials 2 and the surface electrodes 6 instead of the resin layer 4.

In FIG. 25 (B), the resin layer 4a is arranged between piezoelectric materials 2 and the surface electrodes 6 and is in a layer form to cover the entire surfaces of the piezoelectric materials 2. Moreover, the surface electrodes 6 are provided on a surface of the resin layer 4a to cover the entire surface of the resin layer 4a. Typically, a conductive material having softness relatively higher than that of the material used for the piezoelectric materials 2 is used as the material used for the resin layer 4a. The resin layer 4a is constituted by electrically conductive powder and resin. Examples of the electrically conductive powder can include metal powder and a electrically conductive filler such as graphite and examples of the resin can include the materials described above in the third embodiment. Accordingly, also when voltage is applied to the surface electrodes 6, a predetermined electric field is applied on the piezoelectric materials 2. The resin layer 4a is formed on the surfaces of the piezoelectric materials 2 by dip or the like, for example, and is in a helical form with respect to the core material 1 as in the surface electrodes 6. It should be noted that the insulating portions 3 may be interposed between the piezoelectric materials 2 adjacent to each other in the length direction of the core material 1 as in the first embodiment.

Also in this modified example, the resin layer 4a can absorb external impact and reduce cracks.

<Piezoelectric Coil Apparatus>

Figure 26:
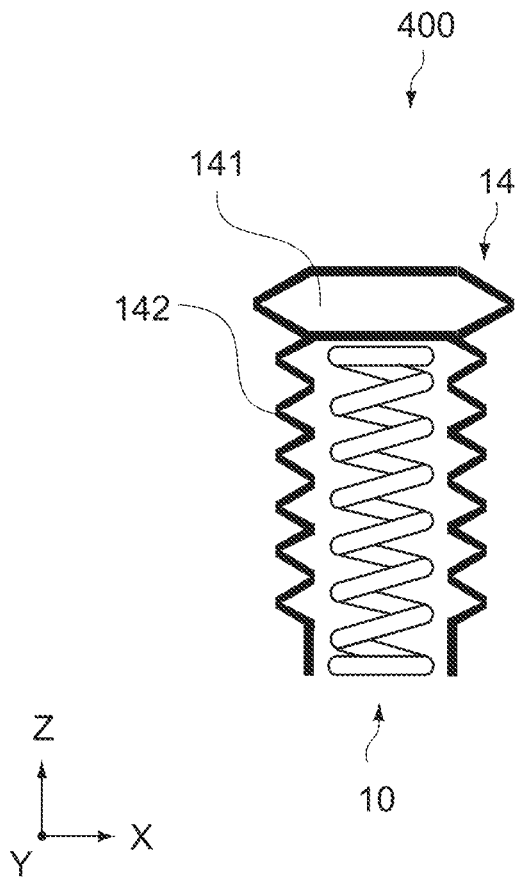
FIG. 26 A side cross-sectional view of the piezoelectric coil apparatus.

FIG. 26 is a side cross-sectional view of a piezoelectric coil apparatus 400. Hereinafter, configurations different from those of the first embodiment will be mainly described, configurations similar to those of the first embodiment will be denoted by similar reference signs, and descriptions thereof will be omitted or simplified.

In the present embodiment, the piezoelectric coil apparatus 400 includes a piezoelectric coil 10 and a casing 14 that houses the piezoelectric coil 10 and has extension and contraction properties or bending properties with respect to the central axial direction of the piezoelectric coil 10. As shown in FIG. 26, the casing 14 has a bellow structure. Moreover, a material for the casing 14 is typically made of resin or metal. In a case where the casing 14 is made of resin, for example, polyethylene, polyester, or the like can be employed. In case where the casing 14 is made of metal, for example, stainless or aluminum can be employed. As to whether the casing 14 is made of resin or metal, the material is selected depending on parameters of the piezoelectric coil 10. That is, in a case of the piezoelectric coil 10 that provides large generated force and small displacement, the casing 14 can be made of metal having a relatively large Young's modulus. On the other hand, in a case of the piezoelectric coil 10 that provides small generated force and a large displacement, it is more favorable that the casing 14 is made of resin having a relatively small Young's modulus. Moreover, the casing 14 has a bellow portion 142 and a main portion 141 excluding the bellow portion, and it is favorable that the material for the bellow portion 142 has a smaller Young's modulus than the material for the main portion 141.

Moreover, in a case where the casing 14 in which the piezoelectric coil 10 is housed is made of metal and discharge of electricity can occur between the piezoelectric coil 10 and the casing 14, the inside of the metal casing 14 may be coated with insulative resin or insulation may be ensured by using the surface electrodes 6 as the ground like the piezoelectric coil 200. Otherwise, insulation may be ensured by covering the entire surfaces of the surface electrodes 6 with the resin layer 4 like the piezoelectric coil 300.

In the present embodiment, the piezoelectric coil apparatus 400 having moisture resistance can be provided by housing the piezoelectric coil 10 in the casing 14 having the extension and contraction properties or bending properties.

It should be noted that the present technology can also take the following configurations.

(1) A piezoelectric coil, including:
 a coil-like core material; and
 a plurality of band-like piezoelectric materials that is helically wound around the core material so as to be alternately arranged along the core material.

(2) The piezoelectric coil according to (1), in which the number of piezoelectric materials ranges from 2 to 10.

(3) The piezoelectric coil according to (2), in which the number of piezoelectric materials ranges from 3 to 5.

(4) The piezoelectric coil according to any one of (1) to (3), in which the piezoelectric material is wound around the core material at an angle within a range of 45 degrees±15 degrees.

(5) The piezoelectric coil according to (4), in which the piezoelectric material is wound around the core material at an angle within a range of 45 degrees±10 degrees.

(6) The piezoelectric coil according to any one of (1) to (5), in which an occupancy rate of the piezoelectric material to a surface of the core material is 30% or more.

(7) The piezoelectric coil according to (6), in which the occupancy rate is 60% or more.

(8) The piezoelectric coil according to any one of (1) to (7), in which a Young's modulus of the core material ranges from −60% to +500% with respect to a Young's modulus of the piezoelectric material.

(9) The piezoelectric coil according to (8), in which the Young's modulus of the core material ranges from −50% to +300% with respect to the Young's modulus of the piezoelectric material.

(10) The piezoelectric coil according to (9), in which the Young's modulus of the core material ranges from −40% to +100% with respect to the Young's modulus of the piezoelectric material.

(11) The piezoelectric coil according to any one of (1) to (10), in which the Young's modulus of the piezoelectric coil ranges from 1 kPa to 10 MPa.

(12) The piezoelectric coil according to (11), in which the piezoelectric coil generates electric power by extending and contracting in accordance with a movement of an animal.

(13) The piezoelectric coil according to any one of (1) to (12), further including an electrode portion including a first electrode and a second electrode that sandwiches the piezoelectric material with the first electrode in a thickness direction of the piezoelectric material.

(14) The piezoelectric coil according to (13), in which
the first electrode is the core material, and
the second electrode is a surface electrode provided on a surface of the piezoelectric material.

(15) The piezoelectric coil according to (14), in which
the piezoelectric material includes a plurality of piezoelectric layers stacked in the thickness direction, and
the electrode portion further includes internal electrodes each interposed between respective piezoelectric layers.

(16) The piezoelectric coil according to any one of (13) to (15), in which
the electrode portion applies an electric field on the piezoelectric material in the thickness direction.

(17) The piezoelectric coil according to any one of (1) to (11), (13) to (16), in which
the piezoelectric coil is a piezoelectric actuator using an inverse piezoelectric effect of the piezoelectric material.

(18) The piezoelectric coil according to any one of (1) to (15), in which
the piezoelectric coil is a power generation element using a direct piezoelectric effect of the piezoelectric material.

(19) The piezoelectric coil according to any one of (1) to (18), further including
a bending mechanism that bends the piezoelectric coil in a direction other than a direction of a coil center axis of the piezoelectric coil.

(20) An electronic apparatus, including
a piezoelectric coil including a coil-like core material and a plurality of band-like piezoelectric materials that is helically wound around the core material so as to be alternately arranged along the core material.

(21) The piezoelectric coil according to any one of (13) to (19), in which
the second electrode is a ground electrode that is provided in the surface of the piezoelectric material and opposite to the first electrode in a radial direction.

(22) The piezoelectric coil according to any one of (1) to (19), (21), further including
a resin layer that covers surfaces of the plurality of piezoelectric materials.

(23) The piezoelectric coil according to any one of (13) to (19), (21), in which
the second electrode is provided in the surface of the piezoelectric material in opposite to the first electrode in a radial direction, and
the piezoelectric coil further includes a resin layer arranged between the piezoelectric material and the second electrode.

(24) A piezoelectric coil apparatus, including:
a piezoelectric coil including a coil-like core material and a plurality of band-like piezoelectric materials that is helically wound around the core material so as to be alternately arranged along the core material; and
a case that houses the piezoelectric coil and has an extension and contraction property or a bending property with respect to an axial direction of the piezoelectric coil.

(25) The piezoelectric coil apparatus according to (24), in which
the case is made of resin or metal.

REFERENCE SIGNS LIST 1 core material
2 piezoelectric material
3 insulating portion
5, 7, 11 electrode portion
6 surface electrode
8, 13 piezoelectric layer
9, 12 internal electrode
10 piezoelectric coil

The invention claimed is:

1. A piezoelectric coil, comprising:
a coil-like core material; and
a plurality of band-like piezoelectric materials
that is helically wound around the core material so as to be alternately arranged along the core material,
wherein a number of piezoelectric materials ranges from 2 to 10, and
wherein an occupancy rate of the piezoelectric material to a surface of the core material is 30% or more.

2. The piezoelectric coil according to claim 1, wherein the number of piezoelectric materials ranges from 3 to 5.

3. The piezoelectric coil according to claim 1, wherein the piezoelectric material is wound around the core material at an angle within a range of 45 degrees±15 degrees.

4. The piezoelectric coil according to claim 2, wherein the piezoelectric material is wound around the core material at an angle within a range of 45 degrees±10 degrees.

5. The piezoelectric coil according to claim 1, wherein the occupancy rate is 60% or more.

6. The piezoelectric coil according to claim 1 wherein a Young's modulus of the core material ranges from −60% to +500% with respect to a Young's modulus of the piezoelectric material.

7. The piezoelectric coil according to claim 6, wherein the Young's modulus of the core material ranges from −50% to +300% with respect to the Young's modulus of the piezoelectric material.

8. The piezoelectric coil according to claim 7, wherein the Young's modulus of the core material ranges from −40% to +100% with respect to the Young's modulus of the piezoelectric material.

9. The piezoelectric coil according to claim 1, wherein a Young's modulus of the piezoelectric coil ranges from 1 kPa to 10 MPa.

10. The piezoelectric coil according to claim 9 wherein, the piezoelectric coil generates electric power by extending and contracting in accordance with a movement of an animal.

11. The piezoelectric coil according to claim 1, further comprising
an electrode portion including a first electrode and a second electrode that sandwiches the piezoelectric material with the first electrode in a thickness direction of the piezoelectric material.

12. The piezoelectric coil according to claim 11, wherein the first electrode is the core material, and
the second electrode is a surface electrode provided on a surface of the piezoelectric material.

13. The piezoelectric coil according to claim 12, wherein the piezoelectric material includes a plurality of piezoelectric layers stacked in the thickness direction, and the electrode portion further includes internal electrodes each interposed between respective piezoelectric layers.

14. The piezoelectric coil according to claim 11, wherein the electrode portion applies an electric field on the piezoelectric material in the thickness direction.

15. The piezoelectric coil according to claim 1, wherein the piezoelectric coil is a piezoelectric actuator using an inverse piezoelectric effect of the piezoelectric material.

16. The piezoelectric coil according to claim 1, wherein the piezoelectric coil is a power generation element using a direct piezoelectric effect of the piezoelectric material.

17. The piezoelectric coil according to claim 1, further comprising a bending mechanism that bends the piezoelectric coil in a direction other than a direction of a coil center axis of the piezoelectric coil.

18. An electronic apparatus, comprising
the piezoelectric coil according to claim 1 including the coil-like core material and the plurality of band-like piezoelectric materials that is helically wound around the core material so as to be alternately arranged along the core material.

19. The piezoelectric coil according to claim 1, wherein the coil-like core material includes Mg alloy, Al, Ti, SUS, W, Au, Ag, Cu, or Pt.

20. The piezoelectric coil according to claim 19, wherein the coil-like material includes Mg alloy, Al, Ti, or SUS.

21. The piezoelectric coil according to claim 20, wherein the coil-like material includes Al.

22. The piezoelectric coil according to claim 1, wherein the number of piezoelectric materials is 4.

* * * * *